US 8,232,799 B2
Jul. 31, 2012

(12) United States Patent
Hajian et al.

(54) NOISE REDUCTION APPARATUS, SYSTEMS, AND METHODS

(75) Inventors: Arsen R. Hajian, Waterloo (CA); Jae K. Kim, Tucson, AZ (US)

(73) Assignee: Arjae Spectral Enterprises, Tucson, AZ (US)

(*) Notice: Subject to any disclaimer, the term of this patent is extended or adjusted under 35 U.S.C. 154(b) by 917 days.

(21) Appl. No.: 12/324,291

(22) Filed: Nov. 26, 2008

(65) Prior Publication Data

US 2009/0136104 A1    May 28, 2009

Related U.S. Application Data

(60) Provisional application No. 61/044,228, filed on Apr. 11, 2008, provisional application No. 61/004,427, filed on Nov. 27, 2007.

(51) Int. Cl.
*G01V 3/00* (2006.01)

(52) U.S. Cl. ........................ 324/309; 324/318

(58) Field of Classification Search .......... 324/300–322, 324/622; 600/407–422, 509; 382/128, 280, 382/260; 379/341, 238, 296
See application file for complete search history.

(56) References Cited

U.S. PATENT DOCUMENTS

| | | | |
|---|---|---|---|
| 4,737,713 A | 4/1988 | Danby et al. | |
| 4,777,438 A | 10/1988 | Holland | |
| 5,248,943 A | 9/1993 | Fox et al. | |
| 7,110,941 B2* | 9/2006 | Li | 704/200.1 |
| 7,206,073 B2 | 4/2007 | Hajian et al. | |
| 7,315,822 B2* | 1/2008 | Li | 704/500 |
| 7,366,294 B2* | 4/2008 | Chandran et al. | 379/341 |
| 7,428,270 B1* | 9/2008 | Dubuc et al. | 375/316 |
| 8,031,861 B2* | 10/2011 | Chandran et al. | 379/341 |
| 2005/0258831 A1 | 11/2005 | Alvarez et al. | |
| 2010/0141269 A1* | 6/2010 | Quan | 324/622 |
| 2011/0002472 A1* | 1/2011 | Quan | 381/58 |
| 2011/0015532 A1* | 1/2011 | Koertge et al. | 600/509 |

FOREIGN PATENT DOCUMENTS

| | | |
|---|---|---|
| EP | 0 411 840 A2 | 2/1991 |
| EP | 0 554 584 A1 | 11/1991 |
| EP | 0 460 761 A1 | 12/1991 |
| EP | 0 467 378 A2 | 1/1992 |
| EP | 1 205 760 A2 | 5/2002 |
| JP | 5-154128 | 6/1993 |
| JP | 9-024036 | 1/1997 |

OTHER PUBLICATIONS

Chang et al., "Reconfigurable Architectures for Low Complexity Software Radio Channelizers Using Hybrid Filter Banks", *IEEE* 2006, pp. 1-5.

Klein et al., "Enhancement Signal-to-Noise Ratio by Continuous Averaging: Application to Magnetic Resonance", *The Review of Scientific Instruments* 34:7, Jul. 1963, pp. 754-759.

(Continued)

*Primary Examiner* — Brij Shrivastav
(74) *Attorney, Agent, or Firm* — K&L Gates LLP

(57) ABSTRACT

This document describes a general system for noise reduction, as well as a specific system for Magnetic Resonance Imaging (MRI) and Nuclear Quadrupole Resonance (NQR). The general system, which is called Calculated Readout by Spectral Parallelism (CRISP), involves reconstruction and recombination of frequency-limited broadband data using separate narrowband data channels to create images or signal profiles. A multi-channel CRISP system can perform this separation using (1) frequency tuned hardware, (2) a frequency filter-bank (or equivalent), or (3) a combination of implementations (1) and (2). This system significantly reduces what we call cross-frequency noise, thereby increasing signal-to-noise-ratio (SNR). A multi-channel CRISP system applicable to MRI and NQR are described.

66 Claims, 18 Drawing Sheets

OTHER PUBLICATIONS

DeSalvo, "Advanced architecture for voice collection systems", *Defense Electronics*, www.rfdesign.com, pp. 17-20.
Lustig et al., "Multiple Narrow-Band Excitations Spiral Imaging", *Proc. Intl. Soc. Mag. Reson. Med.* 15 (2007), p. 1808.

International Search Report for PCT/US2008/084945, mailed Mar. 4, 2009 (5 pages).
Written Opinion of the ISR for PCT/US2008/084945, mailed Mar. 4, 2009 (10 pages).

* cited by examiner

STEP 1: Incoming broadband radiation or vibration is collected by signal collector as a time series signal. The noise in this time series includes target noise. The majority of target noise is cross-frequency noise.

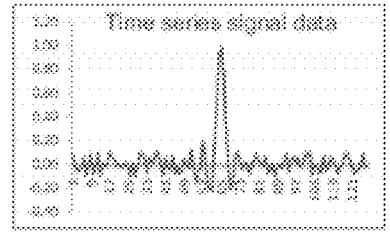

STEP 2: The time series signal is sent to a single-channel receiver. The frequency response of the channel is defined by a bandpass function. The time series signal is filtered by the channel bandpass. Cross-frequency noise is maintained during the digital sampling process, resulting in the recorded time series data.

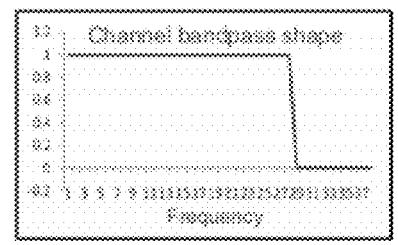

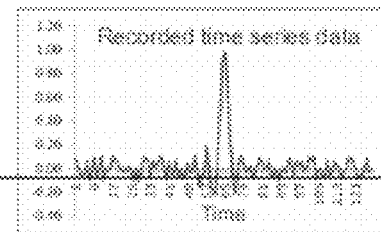

STEP 3: The recorded time series data is Fourier Transformed to generate the final result. The underlying (i.e. noiseless) result is also shown for reference. The noise in the recorded time series appears as noise at all frequencies in the final result.

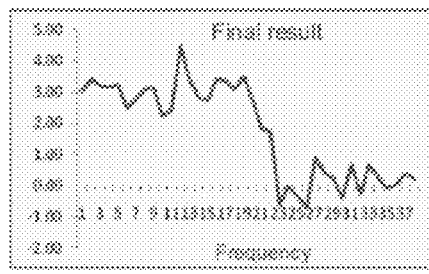 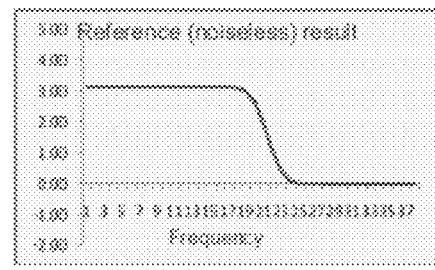

Figure 2A-2

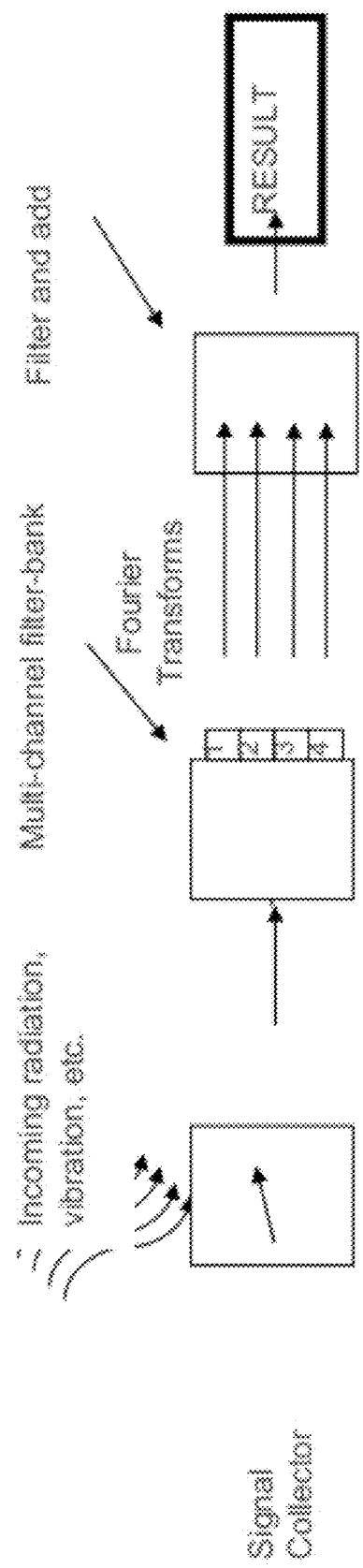

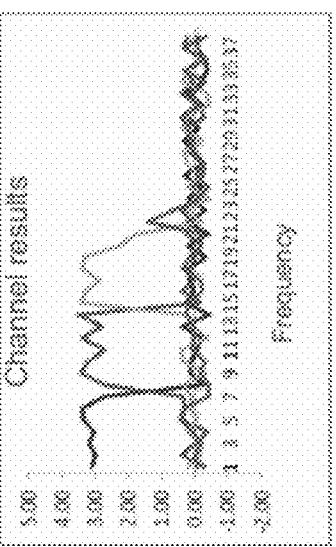

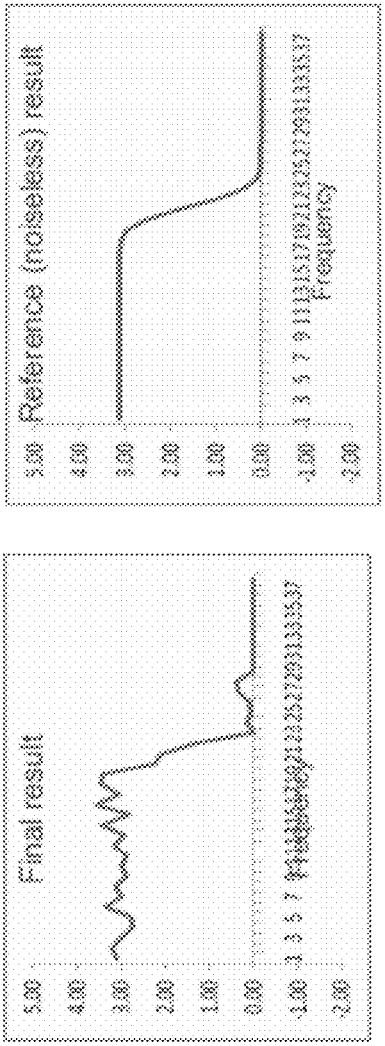

STEP 3: The recorded time series data for each channel is Fourier Transformed. The noise detected during the time series is applied to each frequency comprising the channel. No noise from the other channels is introduced into each channel, reducing cross frequency noise as compared to Figure 2A-2.

STEP 4: The Fourier Transform of the recorded time series data for each channel is filtered by clipping outside the channel bandpass, and the results of each channel are summed, generating the final result. The act of clipping reduces cross-frequency noise between channels.

Figure 2D-3

NOISE REDUCTION APPARATUS, SYSTEMS, AND METHODS

RELATED APPLICATIONS

This application claims priority to U.S. Provisional Patent Application 61/004,427 filed on Nov. 27, 2007, U.S. Provisional Patent Application 61/044,228 filed on Apr. 11, 2008, the disclosures of which are herein incorporated by reference in their entirety.

FIELD OF THE INVENTION

The invention relates generally to the field of noise reduction in data acquisition systems. Specifically, the invention relates to methods and devices for reducing noise and other effects when data is collected.

BACKGROUND OF THE INVENTION

In general, there are numerous scanning technologies by which a physical object, compound, biological entity, or other sample can be investigated using targeted waves. Many modern day wave-based scanning technologies used to evaluate samples collect a multi-spectral signal using a signal collector, receive the signal (mix, filter, digitally sample), and then perform a mathematical transformation, typically a Fourier Transform (FT) or Inverse Fourier Transform (IFT) to create a final image or image/signal profile.

The waves that are used in these technologies can be electromagnetic or mechanical. Technologies based on nuclear magnetic resonance (NMR) or nuclear quadrupole resonance (NQR) use electromagnetic waves to obtain information about a sample. These types of scanning technologies non-destructively evaluate biological samples and non-biological samples alike. In all cases, the resulting information is then used to create images or image/signal profiles.

Implicit in the resulting images and image/signal profiles in these technologies is a significant noise component relative to that of the desirable signal component. Many improvements to signal-to-noise ratio (SNR) in these scanning technologies focus on improving signal, and thereby improving SNR. The SNR, however, can also be increased by reducing noise. Methods to reduce noise, such as signal averaging, however, typically have an incremental effect on overall SNR, at the cost of scan time or spatial resolution.

The present invention describes a fundamental change in how scan data is collected and processed such that noise is substantially reduced compared to present scanning technologies. As such, the present invention represents a significant achievement in SNR improvement methodology and devices.

SUMMARY OF THE INVENTION

In one aspect the invention relates to a method of processing multi-frequency signals. The method includes the steps of obtaining a multi-frequency signal; separating the multi-frequency signal into a plurality of frequency bands, each band of the plurality of frequency bands having a respective bandwidth; removing a noise component from each of the plurality of frequency bands to generate a plurality of noise-reduced frequency bands; and combining a predefined number of noise-reduced frequency bands to form a combined noise-reduced frequency signal.

In one embodiment of the method, the multi-frequency signal is selected from the group consisting of radio frequency signals and acoustic signals. The step of separating the signal is preformed by utilizing one of: a plurality of filters in communication with a detector; and a plurality of frequency-tuned detectors. Further, the step of removing a noise component from each of the plurality of frequency bands comprises the step of Fourier transforming each of the plurality of frequency components. The step of combining a predetermined number of noise-reduced frequency components can include summing the plurality of Fourier-transformed noise-reduced frequency bands. Further, the multi-frequency signal is selected from the group consisting of a magnetic resonance signal or a nuclear quadrupole resonance signal. In one embodiment, the multi-frequency signal is an ultrasound signal. The method can include the step of transforming the combined noise-reduced frequency signal to generate an image of sample, based on multi-frequency emissions from the sample. In addition, in one embodiment, the impinging wave is selected from the group consisting of a mechanical wave, an electromagnetic wave, an ultrasonic wave, a radio frequency wave, and a terahertz wave.

In one aspect the invention relates to a data acquisition apparatus. The data acquisition apparatus comprises a broadband receiver, the broadband receiver positioned to receive a composite signal comprising a plurality of emissions from a sample portion, the emissions generated in response to the sample; a frequency filter module in electrical communication with the broadband receiver, the filter module suitable for simultaneously filtering the plurality of emissions to generate N bands of narrow band frequency components; a data recorder, the recorder in electrical communication with the filter module such that the data recorder detects the N bands of narrow band frequency components after the narrow band frequency components have been received and filtered; and a processing module, the processing module adapted to remove a noise component from each of the N bands to generate a plurality of noise-reduced frequency bands; and to combine a predefined number of noise-reduced frequency bands to form a combined noise-reduced frequency signal.

In one embodiment of the apparatus, the removal of the noise component from each of the N bands reduces noise in the noise-reduced frequency signal relative to the composite signal by a scale factor. The scale factor is substantially equal to $N^X$, wherein X ranges from 0 to 1. The apparatus can further comprise a detector in electrical communication with the frequency filter module and the processing module, the detector capable of detecting the plurality of filter emissions. The frequency filter module can comprise a plurality of filters, each filter associated with an independent frequency band. In one embodiment, the emissions are generated in response to at least one wave impinging on the sample and wherein the at least one impinging wave is selected from the group consisting of a mechanical wave, an electromagnetic wave, an ultrasonic wave, a radio frequency wave, and a terahertz wave. In another embodiment, the processing module can further comprise a transform module that converts the combined noise-reduced frequency signal into an image of at least the sample portion. In yet another embodiment, the frequency filter module can further comprise a plurality of individual filters, each filter having individual filter characteristics, the filter module configured to modify the individual filter characteristics according to a spectral profile of the composite signal.

In one aspect the invention relates to a method of reducing image noise generated using magnetic resonance data. The method comprises the steps of receiving a composite MRI signal from a sample of interest, the composite MRI signal comprising a plurality of emission frequencies from the sample of interest, wherein detection of the composite MRI signal using a single frequency channel would generate an aggregate noise component N1; filtering the composite MRI signal into a plurality of M narrowband frequency channels; detecting the plurality of M narrow band frequency channels, after filtering the composite MRI signal, such that noise is recorded on a per channel basis such that the sum of the per channel noise components is substantially equally to N2, wherein the ratio of N2 to N1 is less than one.

In one embodiment of the method, the filtering is performed using a frequency filter bank. The method can further comprise the step of transforming the plurality of M narrowband frequency channels and combining a plurality of resultant transformed signals to form an image. In another embodiment, instead of a MRI signal a MRS signal, a MRSI signal, or a NQR signal is used.

In one aspect the invention relates to an apparatus adapted to reduce noise in a wave-based data acquisition system. The apparatus comprises a common signal receiving bus adapted to receive a composite signal; a plurality of isolated output buses; and a frequency filter module comprising a plurality of filter elements, wherein the filter elements each include an input and an output, each of the inputs in electrical communication with the common signal receiving bus, each of the outputs in electrical communication with one of the plurality of isolated output buses, the outputs electrically isolated from the other outputs and each of the inputs, wherein the filter module filters the composite signal to generate N bands of narrow band frequency components and removes a noise component from each of the plurality of frequency bands to generate a plurality of noise-reduced frequency bands.

In one embodiment of the apparatus, the filter elements are selected from the group consisting of analog band pass filters and/or digital band pass filters. In another embodiment of the apparatus, the composite signal is selected from the group consisting of a signal generated from a MRI scan of a sample; and a signal generated from an ultrasound scan of a sample.

In one aspect the invention relates to a method of reducing cross frequency noise in a signal. The method comprises receiving a broadband signal, the signal comprising a plurality of signal portions, each of the plurality of signal portions associated with a band of frequencies; dividing the broadband signal into a plurality of narrowband components; sampling from an analog signal to a digital signal each of the plurality of narrowband components; reconstructing each of the plurality of narrowband components into a plurality of reconstructed components using a discrete transform; and combining the plurality of reconstructed components into a signal profile, the signal profile having an increased signal-to-noise ratio relative to the received broadband signal.

In one embodiment of the method, the method can further comprise the step of generating the broadband signal by impinging a sample of interest with a sound wave. In another embodiment of the method, the method can further comprise the step of generating the broadband signal by generating a magnetic field around a sample of interest. In yet another embodiment of the method, the method can further comprise the step of using a magnetic resonance signal from a sample, regardless of whether or not a magnetic field was applied to the sample. Dividing the broadband signal can further comprise filtering the broadband signal at a frequency filter bank into the plurality of narrowband components. Dividing the broadband signal can further comprise receiving the broadband signal into a plurality of narrowband receivers, each of the narrowband receivers tuned to a unique narrowband frequency range.

In one aspect the invention relates to a noise reduction module for use and improvement of MRI, MRS, MRSI, or NQR. The module comprises at least one antenna, the antenna receiving a broadband signal; a plurality of filters, each of the plurality of filters receiving the broadband signal and passing a narrowband component of the broadband signal, each narrowband component spanning a frequency range; a sampler in communication with the each of the narrowband components, the sampler converting each of the narrowband components from an analog component to a digital component; and a processor, the processor reconstructing a plurality of filtered components, each of the digital components using a transform to reconstruct each of the filtered components, the processor combining the plurality of filtered components to generate a profile.

In one embodiment of the module, the profile is an image. The profile can comprise a signal profile.

In one aspect the invention relates to a noise reduction module for use and improvement of MRI, MRS, MRSI, or NQR. The module comprises more than one antenna, each antenna receiving a narrowband signal; a sampler in communication with the each of the narrowband components, the sampler converting each of the narrowband components from an analog component to a digital component; and a processor, the processor reconstructing a plurality of filtered components, each of the digital components using a transform to reconstruct each of the filtered components, the processor combining the plurality of filtered components to generate a profile. In one embodiment of the module, the profile is an image. The profile can comprise a signal profile.

In one aspect the invention relates to a method of reducing scan time of an analog signal analyzer. The method comprises receiving the broadband signal at an antenna; dividing the broadband signal into a plurality of data channels, each of the data channels spanning a frequency range; individually sampling each of the data channels into a digital components; reconstructing each of the digital components using a discrete transform to form a plurality of reconstructed data sets such that the noise of the data sets is reduced; reducing the scan time of a sample using an effective noise reduction module, the effective noise reduction module adapted to exchange signal to noise quality levels for scan time; and combining the reconstructed data sets to form a signal profile.

In one aspect the invention relates to a multi-channel data processing system. The system comprises a plurality of receiver coils, the receiver coils receiving an input signal, each of the coils filtering the input signal into a plurality of data channels; each of the data channels having a unique center frequency and associated with one of the plurality of coils; an A/D converter attached to each data channel, each data channel sampled at a sampling rate; a processor performing a multi-spectral transform such as an Inverse Fourier Transform on each of the data channels, the processor outputting a set of reconstructed data; and a summing module adapted to sum the reconstructed data into a signal profile.

In one aspect the invention relates to a method of improving the effective magnetic strength of a magnetic resonance data acquisition system. The method comprises obtaining a multi-frequency signal; separating the multi-frequency signal into a plurality of frequency bands, each band of the plurality of frequency bands having a respective bandwidth; removing a noise component from each of the plurality of frequency bands to generate a plurality of noise-reduced frequency bands; and regulating the combination of a predefined number of noise-reduced frequency bands to form a combined noise-reduced frequency signal and control the effective strength of the data acquisition system.

In one aspect the invention relates to a method of reducing sample scan period during magnetic resonance data acquisition relative to a conventional MRI scan period $T_1$, the conventional MRI scan period having an associated data quality level. The method comprises the steps of scanning a sample of interest for a scan period $T_2$ while obtaining a multi-frequency signal, the signal comprising MRI data for a sample of interest, wherein the scan period $T_2$ is substantially equal to $T_1/N$; separating the multi-frequency signal into a plurality of frequency bands, each band of the plurality of frequency bands having a respective bandwidth, wherein N is a function of a count of the plurality of frequency bands; removing a noise component from each of the plurality of frequency bands to generate a plurality of noise-reduced frequency bands; and combining a predefined number of noise-reduced frequency bands to form a combined noise-reduced frequency signal, the combined noise-reduced frequency having a substantially equivalent data quality level.

In one aspect the invention relates to a method of reducing the number of data samples used to produce a profile. The method comprises the steps of generating a broadband signal; dividing the broadband signal into narrowband components; sampling the narrowband components at reduced sampling rates using a sampler configured based on reduced Nyquist-Shannon sampling rate limitations associated with sampling of the narrowband components rather than the broadband signal; and transforming and recombining a sampled signal from each narrowband component into the profile. In one embodiment of the method, the profile is selected from the group consisting of an image, an image profile, a signal, and a signal profile.

In one aspect the invention relates to a method of acquiring NQR data with respect to a target. The method comprises the steps of serially applying electromagnetic radiation to the target to excite various frequency ranges associated with the nuclei of the target and thereby generate nuclear quadrupole resonance effects from the target; detecting the nuclear quadrupole resonance effects from each frequency range in sequence; and repeating this process of serial application and detection to each frequency range using a repetition interval. In one embodiment of the method, each step is performed using a coil in electrical communication with a CRISP NQR frequency filter-bank. In another embodiment of the method, at least one step of applying electromagnetic radiation to the target is performed simultaneously with at least one step of detecting one of the nuclear quadrupole resonance effects. In yet another embodiment of the method, one step of applying electromagnetic radiation to the target is performed simultaneously with all other steps of applying electromagnetic radiation to the target. In yet another embodiment of the method, one step of detecting one of the nuclear quadrupole resonance effects is performed simultaneously with other steps of detecting one of the nuclear quadrupole resonance effects. In yet another embodiment of the method, at least one of the steps of applying radiation and one of the steps of detecting one of the nuclear quadrupole resonance effects is performed in an interleaved manner as a function of a time period $T_1$. Time period $T_1$ can be related to a relaxation period associated with a particular nuclear species. The repetition interval of excitation and detection for each frequency range may vary according to the relaxation properties of the main target substances such that not every frequency range may be excited during every repetition interval.

In one aspect the invention relates to a method of processing data. The method comprises obtaining a multi-frequency signal; separating the multi-frequency signal into a plurality of narrow frequency bands, each band of the plurality of narrow frequency bands having a respective bandwidth; removing a noise component from each of the plurality of narrow frequency bands to generate a plurality of noise-reduced narrow frequency bands; and transforming each respective noise-reduced narrow frequency band independently to generate a plurality of individual transform sets such that cross-frequency noise contributions are reduced; and combining a predefined number of the of individual transform sets to generate a combined noise-reduced frequency signal.

In one aspect the invention relates to a method of detecting a material of interest. The method comprises the steps of selecting a plurality of frequency ranges suitable for exciting nuclear quadrupole resonance effects in a material of interest; obtaining a plurality of NQR data sets in response to excitation and detection of effects for a candidate object, the excitation generated in response to the plurality of frequency ranges; correlating the plurality of NQR data sets relative to each other and known nuclear quadrupole resonance data associated with the material of interest; and determining a probability that the material of interest is present in the candidate object.

In one aspect the invention relates to method of processing multi-frequency signals. The method comprises (a) obtaining a multi-frequency signal using a signal receiving element; (b) separating the multi-frequency signal into a plurality of frequency bands, each band of the plurality of frequency bands having a respective bandwidth; (c) removing a noise component from each of the plurality of frequency bands to generate a plurality of noise-reduced frequency bands; and (d) combining a predefined number of noise-reduced frequency bands to form a combined noise-reduced frequency signal.

In one embodiment of the method, the signal receiving element is selected from the group consisting of a plurality of coils, a single coil, and an element for performing the step of separating the multi-frequency signal is selected from the group consisting of a plurality of coils, a filter-bank element, and a plurality of filter bank elements. In another embodiment of the method, the noise removal in (c) is a reduction of noise performed as a function of a signal level associated with the multi-frequency signal. With respect to yet another embodiment of the method, the combination of data in (d) occurs by a step selected from the group of concatenating and mathematical combining which is performed using data associated with the noise-reduced frequency bands. In another embodiment, the multi-frequency signal is a MRI generated signal and the receiving element comprises a plurality of RF coils, wherein the RF coils are parallel configured to reduce signal acquisition time or increase spatial resolution in a phase encoding direction. In one embodiment, a processing step is selected from the group consisting of acquiring narrowband data, reconstructing intra-band data, and inter-band data recombination is performed with respect to the multi-frequency signal to reduce cross-frequency noise.

In one embodiment, the multi-frequency signal is generated by exciting a target portion of a target volume, the target volume comprising a plurality of target portions wherein the signal receiving element is a narrowband channel signal receiver. One narrowband multi-frequency signal can be generated for each target portion of the target volume. Further, a combination of a plurality of target portions can be excited such that the multi-frequency signal is received by a plurality of narrowband channel signal receivers. In one embodiment, the signal receiving element is a plurality of coils. At least one of the coils can be oriented in a phase encoding direction or a frequency encoding direction. In addition, at least one of the coils can be oriented in a direction other than a phase encoding direction or a frequency encoding direction. In another embodiment, the method further comprises the step of performing spectral division of the multi-frequency signal such that an increase in a signal-to-noise ratio occurs relative to not performing the spectral division. In another embodiment, the step of removing the noise component from each of the plurality of frequency bands includes identifying a plurality of magnetic gradients that encode a known spatial displacement of noise in resulting images and reducing the noise in a final image by using this known spatial displacement.

In one aspect, the invention relates to a method of reducing noise associated with a data collection event. This method includes various steps. Initially, incoming radiation/vibration is detected by signal collector as a time series signal. The time series signal is sent to a multi-channel frequency filter-bank receiver (with one or more channels). Next, the time series signal is filtered by each channel bandpass prior to A/D conversion. In addition, the recorded time series data for each channel is Fourier transformed. The noise detected during the time series is applied to each frequency comprising the channel. No noise from the other channels is introduced into each channel, thereby reducing cross frequency noise. Finally, the Fourier Transform of the recorded time series data for each channel is filtered by clipping outside the channel bandpass, and the results of each channel are summed, generating the final result. The act of clipping reduces cross-frequency noise between channels.

Although reference is made to CRISP and cross-frequency noise throughout the application, the systems and method described herein are generally directed to reducing or removing noise in any wave-based data collection system. As a result, the methods and systems described herein are not limited to a particular theory or mechanism.

It should be understood that the terms "a," "an," and "the" mean "one or more," unless expressly specified otherwise.

The foregoing, and other features and advantages of the invention, as well as the invention itself, will be more fully understood from the description, drawings, and claims which follow.

BRIEF DESCRIPTION OF THE DRAWINGS

These embodiments and other aspects of this invention will be readily apparent from the detailed description below and the appended drawings, which are meant to illustrate and not to limit the invention, and in which:

FIGS. 2A-1 and 2A-2 depict a conventional Fourier signal system and the steps used in processing such a Fourier signal according to an illustrative embodiment of the invention.

FIGS. 2D-1, 2D-2, and 2D-3 show a signal detection system that uses a single collector and multi-channel filter bank and the steps used in processing incoming signals according to an illustrative embodiment of the invention.

The claimed invention will be more completely understood through the following detailed description, which should be read in conjunction with the attached drawings. In this description, like numbers refer to similar elements within various embodiments of the present invention.

DETAILED DESCRIPTION

Figure 1:
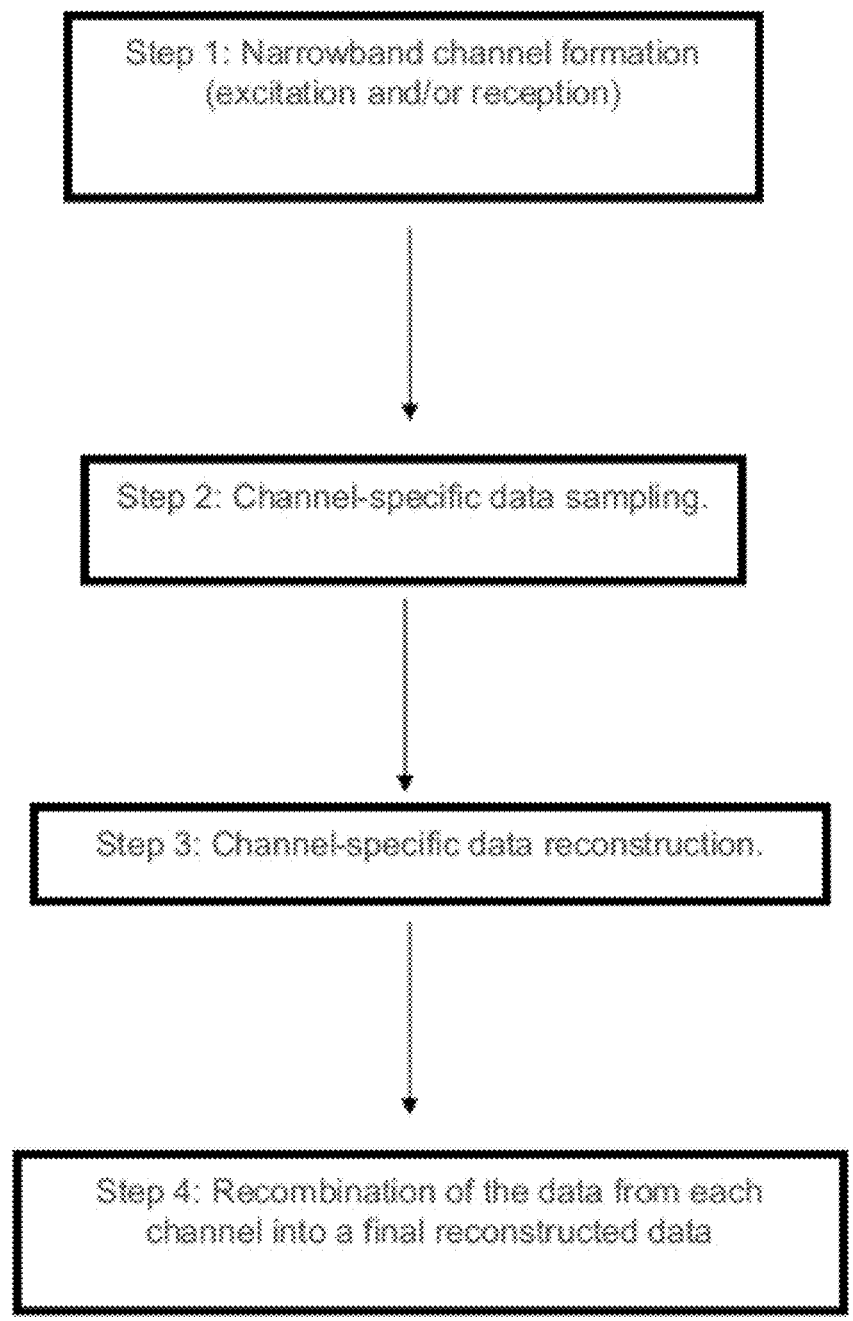
FIG. 1 is a process flow of an exemplary method for processing multi-frequency signals, such as a Calculated Readout by Spectral Parallelism (CRISP) method, according to an illustrative embodiment of the invention.

The following description refers to the accompanying drawings that illustrate certain embodiments of the present invention. Other embodiments are possible and modifications may be made to the embodiments without departing from the spirit and scope of the invention. Therefore, the following detailed description is not meant to limit the present invention. Rather, the scope of the present invention is defined by the appended claims.

It should be understood that the order of the steps of the methods of the invention is immaterial so long as the invention remains operable. Moreover, two or more steps may be conducted simultaneously or in a different order than recited herein unless otherwise specified.

In general, the aspects and embodiments of the present invention describe methods, apparatus, and systems for significantly improving SNR for a wave-based data acquisition system. In various known interpolation based and other known algorithmic solutions, the gains in SNR are calculated in terms of incremental percentages (e.g. 5%-10%). Signal averaging may increase SNR on this order; for example, averaging a noisy signal twice improves the SNR by approximately 41% at a cost of a factor of 2 in integration time.

In contrast, the improvement gains made possible using the devices and methods described herein allow SNR improvement gains that are in terms of factors (5 times better, 10 times better, etc.) at no additional cost in integration time. As such, specific implementations of the noise reduction technology of the present invention into various exemplary wave-based scanning technologies using Nuclear Magnetic Resonance (NMR) or Nuclear Quadrupole Resonance (NQR) will substantially increase SNR.

To achieve these increases in SNR, the present invention specifically (1) reduces a type of noise, which is referred to as a type of cross-frequency noise, by signal separation, and by this signal separation, (2) also prolong the oscillation of signal above a noise floor, improving SNR by increased random noise averaging and digitization noise averaging.

The detailed description of the present invention is described in three sections. However, the arrangement of sections is not intended to limit the scope of the invention in any way. Initially, a detailed description of the origin of cross-frequency noise and a detailed description of the present invention for reducing cross-frequency noise is provided. The secondary effect of noise reduction described above is also described. Next, a detailed description of the present invention as applied to exemplary wave-based scanning technologies such as those based on NMR and NQR follows. Finally, a detailed description of applications of the present invention is then provided.

Section One: Cross-Frequency Noise Reduction System

The general origin of cross-frequency noise is presented in this section. Cross-frequency noise occurs in the common situation where a single broadband signal is collected, received (mixed, filtered, digitally sampled), reconstructed using a mathematical transform such as an FT or IFT, and then displayed or stored as an image or signal profile. A general multi-channel CRISP system for reducing cross-frequency noise is described for creation of images and/or image/signal profiles.

Origin of Cross-Frequency Noise

Signal Collection: Consider a signal collector which collects a discrete time series data set, $X_{total}$, consisting of a broad range of frequencies. The collected signal, $X_{total}$, is almost always an electrical signal, but can also be a mechanical signal.

Receiver/Detector: In the signal receiver/detector, the collected signal $X_{total}$ undergoes three processes. First, it is mixed to a lower base frequency. Second, the result is put through a bandpass filter (sampling filter). The order of mixing and filtration may be reversed in some embodiments. Third, the mixed and filtered signal then undergoes analog-to-digital conversion (digital sampling). Analog-to-digital conversion is performed at a sampling rate at least equal to the Nyquist-Shannon sampling rate limit based on the sampling filter bandwidth. The time series data, $X_{total}$, consists of the sum of an underlying signal, $S_{total}$, and a total noise $N_{total}$ (i.e. $X_{total}=S_{total}+N_{total}$), where $S_{total}$ is the total signal, and where $N_{total}$ is the total noise.

Transformation: The desired result is given by a mathematical transform of the sampled signal, typically a Fourier Transform (FT) or Inverse Fourier Transform (IFT). After sampling, an FT/IFT is typically performed on the sampled time series data, using an FFT algorithm to create the frequency series result, $Y_{total}$. Each calculated data point in the frequency series result, $Y_{total}$ is an amplitude and phase representation of the corresponding frequency component of the original time series data, $X_{total}$.

In one embodiment, the total detected noise, $N_{total}$, of the original time series data, $X_{total}$, which includes noise from all frequency components of the collected signal, contributes to every calculated value in the frequency series result, $Y_{total}$. The final reconstructed data has noise contributions from all frequency components, rather than having noise contributions only from the corresponding frequency component that the data point is meant to represent. In one embodiment, this extra noise contribution is identified by the term "cross-frequency noise."

An alternative explanation may be relevant to some embodiments. The position-dependent signal of a target may be encoded as a function of frequency as part of a scanning technology. Each target may be divided up into smaller targets. Each of these smaller targets has a signal component and an associated noise component. The noise spectrum associated with the smaller targets is typically much broader than the signal spectrum of the targets themselves. Therefore, for each of these smaller targets, some parts of their corresponding noise spectrum will be frequency-matched to signal (noise power where there is signal power) and some parts will be frequency-unmatched to signal (noise power where there is no signal power). In the case of the smallest target (a single voxel), all noise contribution that ends up beyond the bounds of the corresponding pixel in the final signal profile is frequency-unmatched voxel noise (alternatively, "cross-frequency noise"). All noise contribution contained within that corresponding pixel from that voxel can be considered frequency-matched voxel noise.

Various definitions of interest are as follows:

Target noise(TN)=frequency-matched TN+frequency-unmatched TN

Voxel noise(VN)=frequency-matched VN+frequency-unmatched VN(cross-frequency noise)

Broadband detection of the entire target signal includes broadband detection of the signal and noise spectra from all these smaller targets. In this case, the frequency-unmatched noise from each voxel will overlap with the frequencies of signal from other voxels such that the noise is inseparable on detection.

Cross-Frequency Noise: Everyday Analogy

An analogy may be used from everyday life. Consider the signal collection, reception/detection of electronic organ music with the use of a single microphone. When the final digitized signal is sent to an oscilloscope, a complex real-time multi-sinusoidal waveform is displayed on the scope as a function of time. Alternatively, there is another way to view this same digitized signal, and that is by the amplitude of frequency components. When viewed on a high-end stereo system in real-time, a bar-graph spectral profile of the music may be displayed using colored light, with small narrowband frequency components of the music being displayed with a lighted bar. This spectral profile represents the Fourier Transform of the waveform seen on the oscilloscope.

Now imagine that three keys on the electronic organ keyboard are pressed and that each key has a frequency corresponding to a distinct bar on the bar-graph spectral profile on the stereo system. In one embodiment, each key has a signal that is equivalent to a pure sinusoid at a corresponding frequency. Associated with each of these signals is a noise component specific to the key that is pressed. This noise component has many frequencies including the frequency associated with the key. The single microphone receives signal and noise from all three keys as a single waveform. That is, the noise contribution from all three keys is received by the microphone all together, rather than individually. A review of the bar-graph spectral profile on the stereo system, three bars will be raised, each signal of which will have noise that is contributed from all three keys. From visual inspection, this is due to the use of a single microphone for reception. The noise contributed to each bar on the bar-graph spectral profile that is contributed by non-related organ keys is cross-frequency noise.

EMBODIMENTS AND ASPECTS OF THE INVENTION (CRISP)

Method of SNR Increase by Cross-Frequency Noise Reduction: CRISP

It is important to understand that by recognizing the presence and the origin of cross-frequency noise, systems to specifically reduce cross-frequency noise may then be developed. It is a common assumption that target noise cannot be reduced as part of any wave-based scanning technology. Contrary to this, this invention describes methods for increasing SNR in images by deliberately reducing the effect of the dominant part of target noise (or cross-frequency noise) in final images.

Signal detection by division of the target signal, with judicious attention to frequency-unmatched target noise, will reduce the overall amount of cross-frequency noise in a transformed data set. That is, if the signal from the smaller targets can be isolated along with only its frequency-matched TN, i.e. the frequency-unmatched TN is eliminated, a substantial noise reduction may occur proportional to the target division. Further reduction in cross-frequency noise may be made by increasing target division. A limit in SNR improvement is reached as the target signal per division is decreased relative to the noise floor, which is due to relevant frequency-matched target noise, as well as noise related to detection such as coil noise and digitization noise. Data recombination into a final target signal profile or image must be performed so that frequency-unmatched TN is not re-introduced.

Put another way, the key to cross-frequency noise reduction is the excitation and/or reception of signal from separate sub-parts of the target into separate narrowband data channels. This can be performed by (1) focused signal excitation of various portions of the target, e.g. narrowband signal excitation, followed by signal reception, and/or (2) focused signal reception from various sub-parts of the target. Signal and noise from target sub-parts can be deliberately separated from other target sub-portions, permitting the deliberate calculation of Fourier data products (i.e. signal profiles or images) with reduced cross-frequency noise.

Figures 1, 2A:
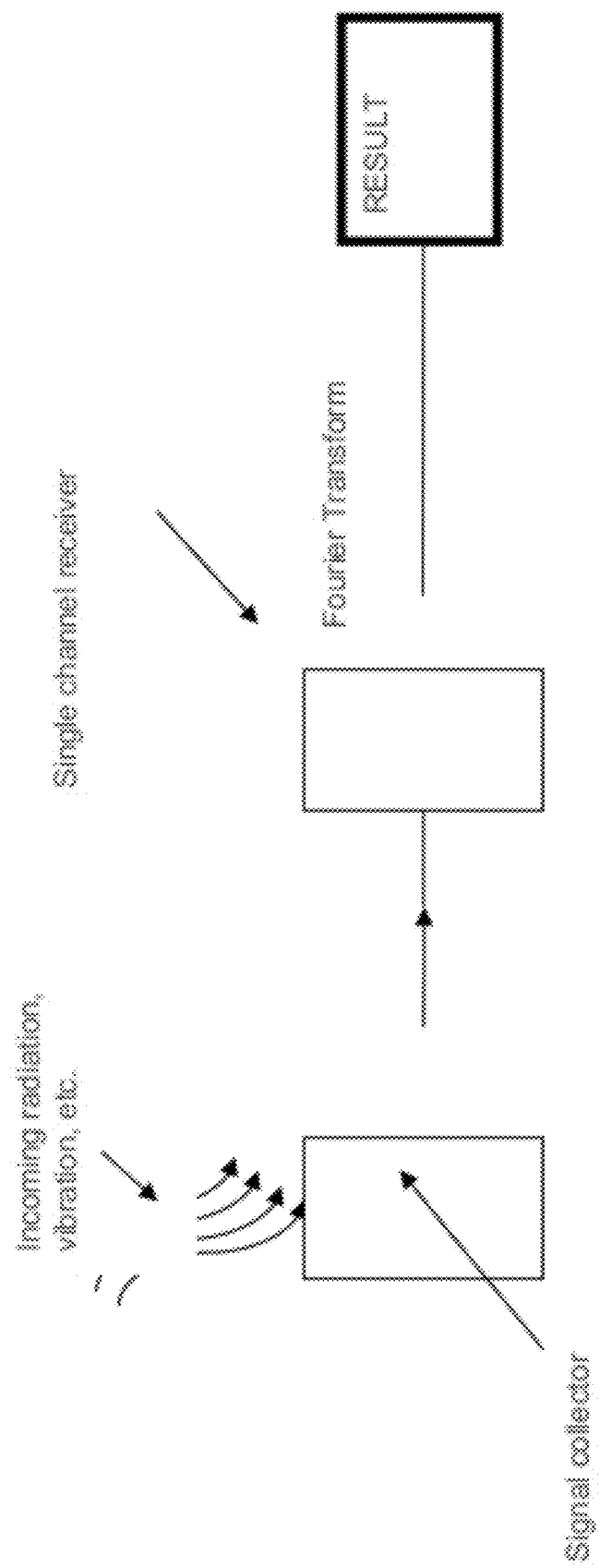
Figure 2B:
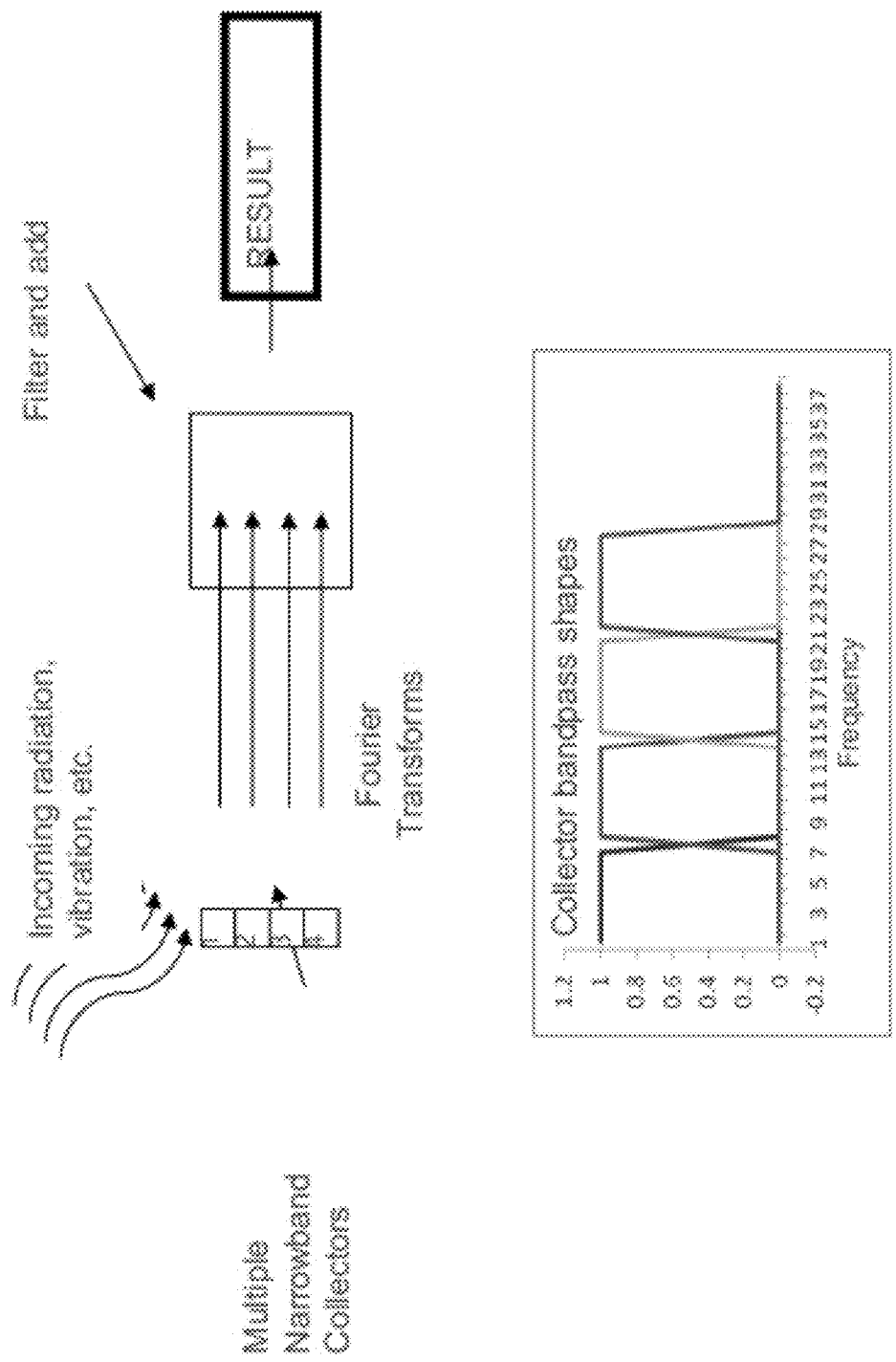
FIG. 2B shows a signal detection system that uses multi-channel filter bank receiver elements according to an illustrative embodiment of the invention.

In one embodiment, the invention relates to systems and methods called Calculated Readout by Spectral Parallelism (CRISP) which reduces cross-frequency noise, requiring both hardware and software components. As shown in FIG. 1, in one embodiment, the systems and methods incorporate some or all of the following steps:
1. Narrowband channel formation (excitation and/or reception)
2 Channel-specific data sampling
3. Channel-specific data reconstruction
4. Recombination of the data from each channel into a final reconstructed data set to create an image or image/signal profile The purpose of a CRISP system is to create an image or signal profile with markedly reduced cross-frequency noise. The effects of this noise-reduction system are more pronounced in situations where target noise dominates the final image noise. For reference, a flowchart of the CRISP process is shown in FIG. 1. In addition, a conventional broadband reception and detection process is shown in FIGS. 2A-1 and 2A-2. Embodiments based on the CRISP and other methods of implementation according to the invention are shown in FIGS. 2B, 2C, 2D-1, 2D-2, and 2D-3.

Additional SNR Increase by Spectral Separation

An important, added, concomitant benefit of spectral separation into narrowband data channels is the separation of higher frequency components away from lower frequency components in the received signal. The aggregate of these frequency components may cause signal to decay quickly. Conversely, the separation of these components lengthens the time of signal decay in each data channel so that there is an increased time period to sample data prior to reaching the noise floor. This added time for sampling increases SNR especially for the following three cases:

(1) signal that typically decays quickly,
(2) targets with inherently low signal, and
(3) signal profiles with high spatial frequency components.

This is due to the effect of averaging two types of noise: random noise and digitization noise. This latter effect would be more pronounced for low signal circumstances where digitization noise would be prominent relative to the actual signal. As a result, this effect would be noticeable, for example, in improving the SNR in collected data regarding higher-spatial frequency components of the resulting transformed Fourier signal profile or for targets with inherently low signal. Specific details relating to the benefits of spectral separation are shown in FIGS. 6A-6C.

Figure 6A:
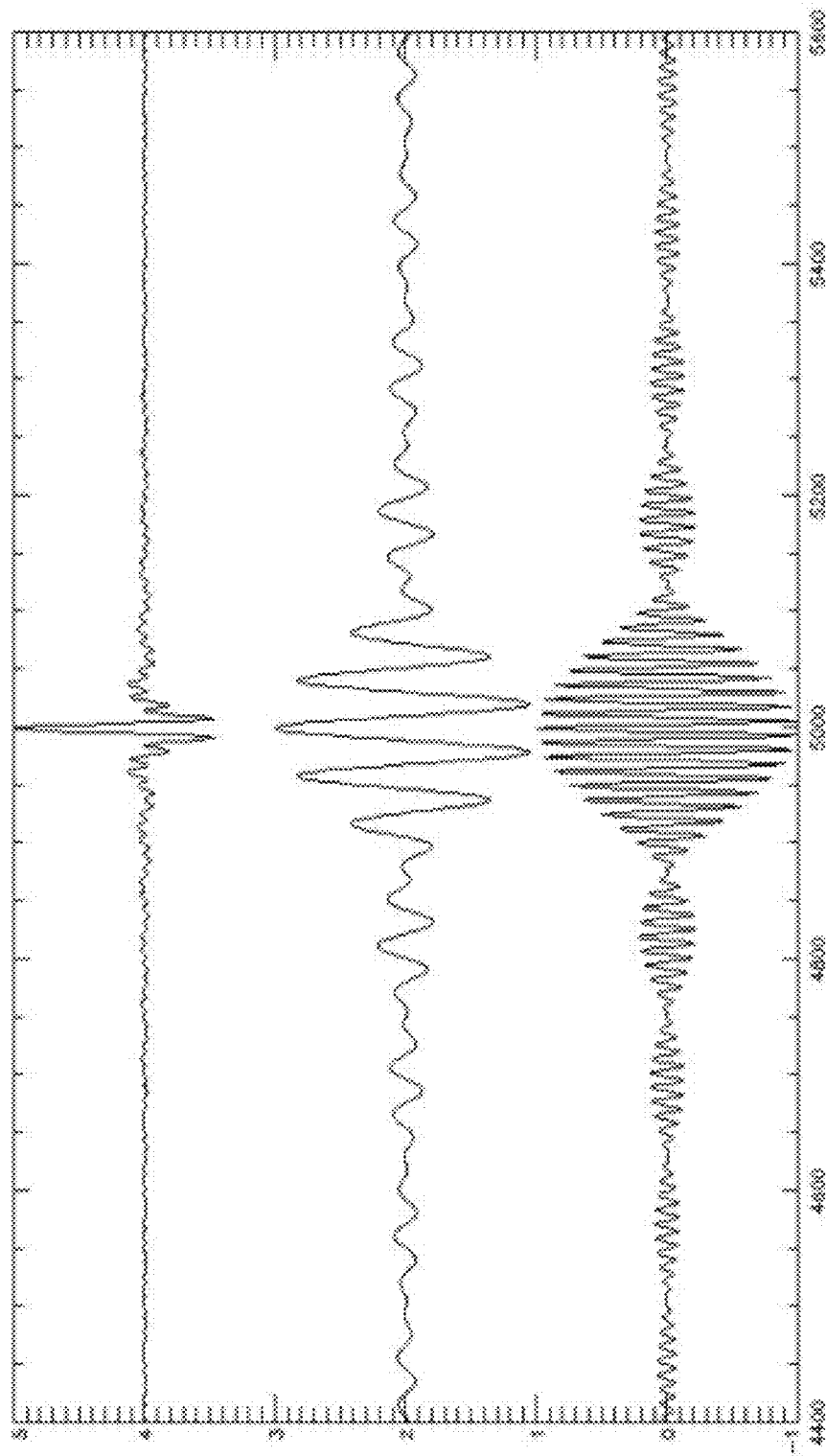
FIG. 6A is a plot that shows an increase in signal amplitude as a result of spectral separation in accordance with an embodiment of the invention.
Figure 6B:
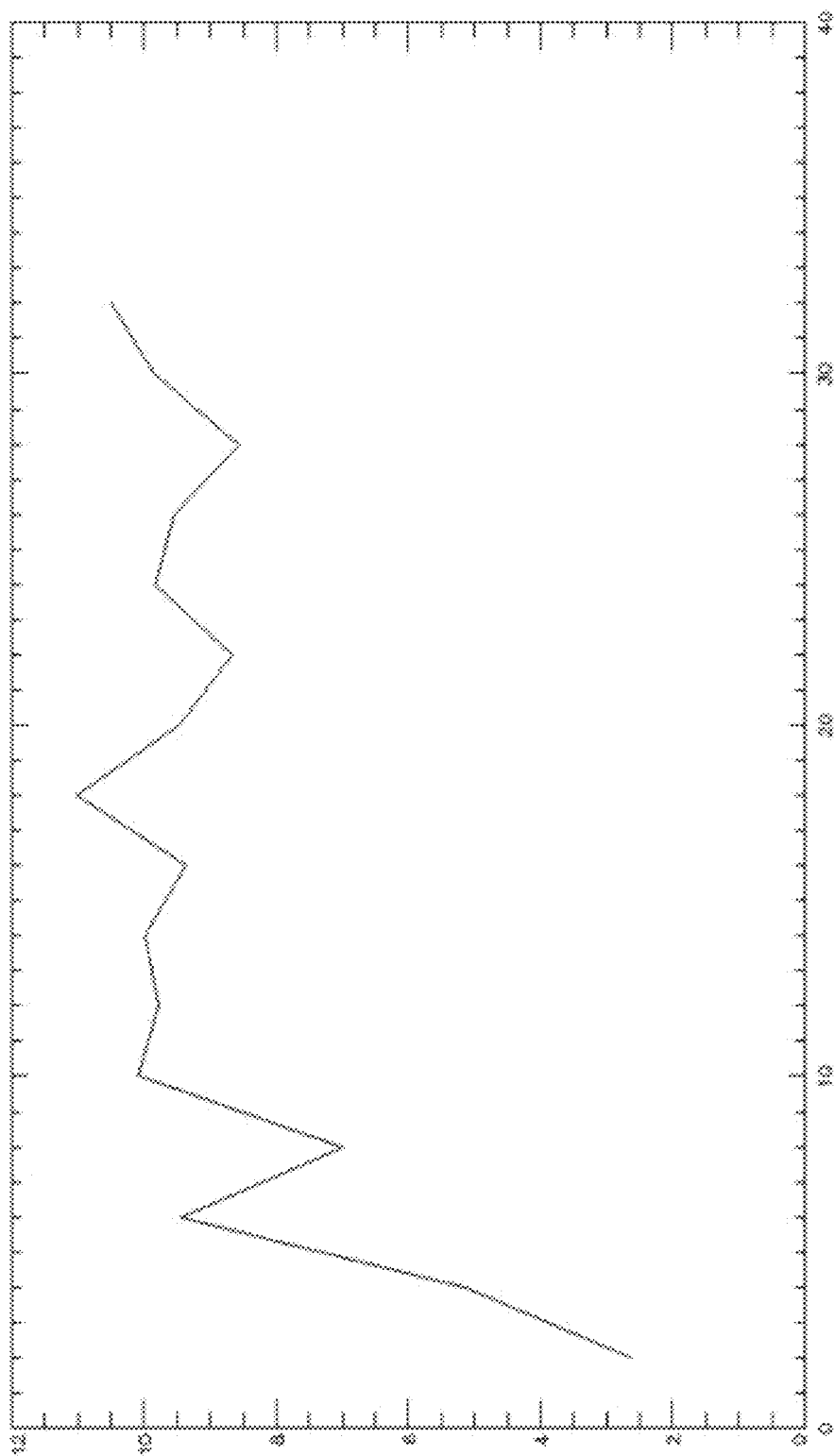
FIG. 6B is a plot that shows the relative ratio of SNR for a multi-channel system in accordance with an embodiment of the invention.
Figure 6C:
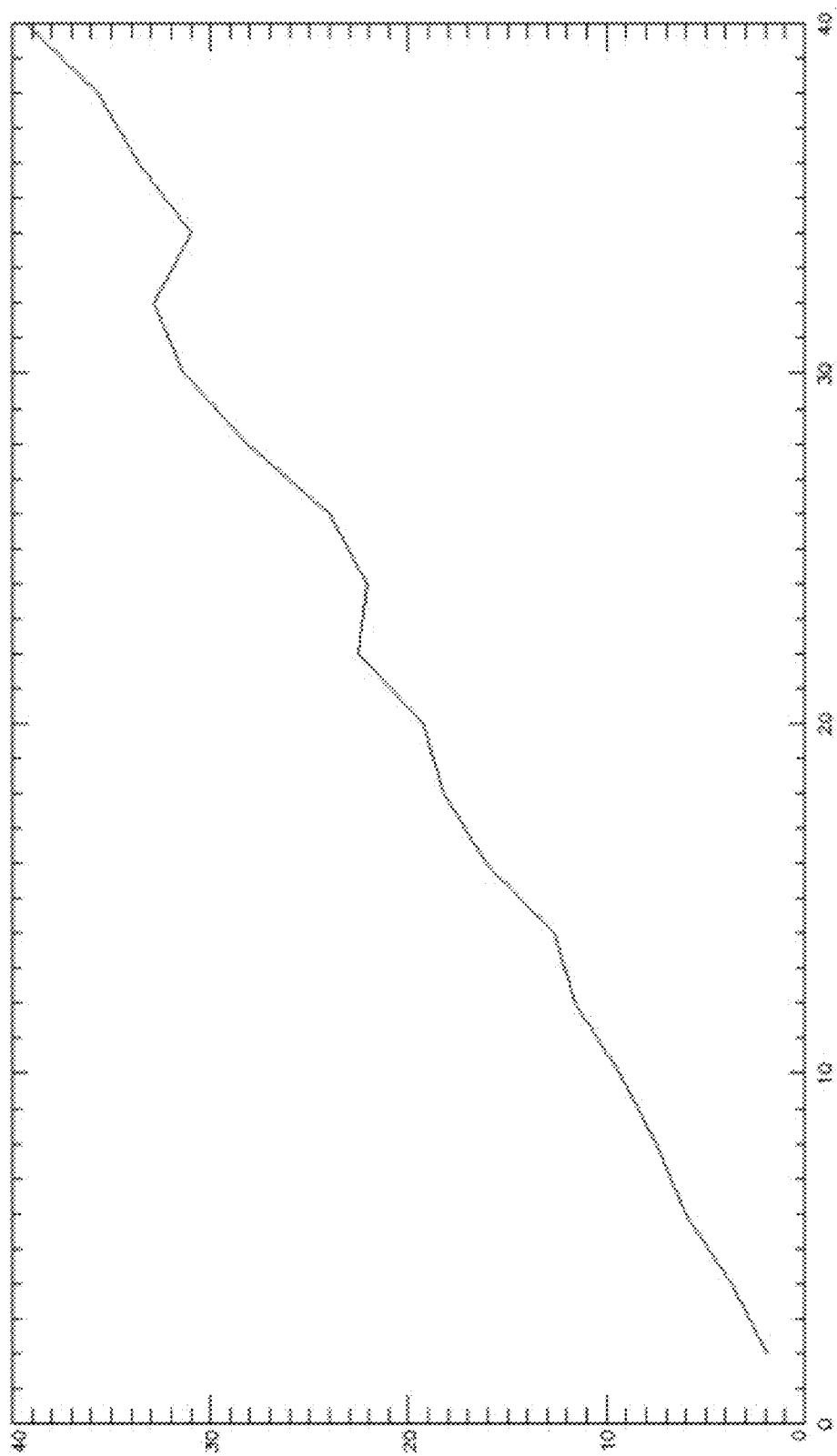
FIG. 6C is a plot that shows the SNR ratio of a system embodiment relative to a conventional system in accordance with an embodiment of the invention.

For example, in FIG. 6A, the presence of increased signal amplitude effects due to spectral separation associated with a given embodiment are shown. Specifically, the plot shows the increase in signal amplitude of free-induction-decay (FID) signal due to the slower signal decay (1D section of 2D image) associated with a given system or method embodiment. The uppermost waveform is the original un-filtered signal. The bottom two FIDs show the signal from the first and last channels of a simulated 10 channel CRISP system. The different frequency center of the two channels is visible and both show a significant signal increase in signal amplitude over the unfiltered signal.

This feature of the methods and system described herein allows for longer sampling times as a result of the slower decay time. In turn, this results in an improved SNR ratio for numerous cases such as when capturing signals that decay quickly, e.g. high $T2^*$ species in MRI. The methods and device described herein also result in an improved SNR ratio when capturing signals that do not necessarily decay quickly, but are relatively low compared to the noise floor such as faint objects. The SNR improvement is also present when capturing signals that are relatively low due to the image features of the corresponding image (Fourier Transform) such as when the high spatial frequency components are relatively low in signal due to image features and would therefore benefit.

Multi-Channel CRISP:
Step 1: Narrowband Channel Formation (Excitation and/or Reception)

A multi-channel CRISP system reduces cross-frequency noise by using multiple separate narrowband data channels (excitation and/or reception). Separately reconstructed data from these data channels is recombined to calculate an image or signal profile. The spectral coverage of all the narrowband data channels is equivalent to the spectral coverage of the original broadband data so that no information is lost. The goal is to isolate frequency-matched noise spectra away from frequency-unmatched noise spectra to reduce overall cross-frequency noise.

In one embodiment, the front end of the multi-channel CRISP system is analog and that the back-end of the multi-channel CRISP system is digital. From the signal and noise that is collected from each target sub-part, only the signal and frequency-matched noise is desired for later data recombination. Frequency-unmatched noise (cross-frequency noise) can be diminished, e.g. zeroed, easily in digital mode prior to data recombination.

In the case of multi-channel CRISP, one of two front-end implementations can be made. Specifically, (1), narrowband components of the single analog signal are directly and separately received into data channels prior to digital sampling, also separately performed in each data channel, e.g. multiple detection coils, and (2) a single analog signal may be collected first, e.g. by a single detection coil, received into a filter-bank front-end to multiple, separate, analog, narrowband data channels, and then digitally sampled in each channel separately.

(1) Direct Narrowband Signal Collection, Reception, and Filtration

Multiple narrowband signal collectors, each tuned to a different narrowband range of frequencies may directly receive a single broadband signal after broadband excitation, or receive multiple narrowband signals excited at different times or in variable combinations. The output of each narrowband signal collector goes to a separate receiver or multiplexed signal receiver. For each data channel, both mixing and narrowband filtration occur. Nominally, the bandpass profile of each narrowband CRISP data channel would be identical except for frequency ranges. Modification of the characteristics of each narrowband receiver can be made, however, similar to the frequency filter-bank case below, whereby the shape, center frequency, and width of the frequency profiles of each CRISP data channel can be changed according to input signal characteristics.

Additional SNR benefit due to spectral separation is obtained as outlined earlier. Further benefit from spectral separation may be obtained on top of this by sending signal from each of these narrowband CRISP data channels into a corresponding frequency filter-bank.

(2) Indirect Narrowband Signal Collection, Reception, and Filtration

In this method, a single broadband signal collector is attached to a frequency filter-bank. Narrowband excitation or coded broadband excitation can be used in combination with this system to reduce cross-frequency noise.

For example, a single broadband signal collector may receive multiple narrowband signals excited at different times or in variable combinations. A single analog signal is collected, mixed, and then sent into a frequency filter-bank, which acts as the front-end to multiple narrowband CRISP data channels. Alternatively, mixing occurs in each data channel separately after filtration.

For example, separate narrowband excitation with corresponding narrowband signal reception through the broadband signal collector and frequency-filter-bank would allow reduction of cross-frequency noise.

Alternatively, the magnitude and strength of asserted readout gradients will cause variable mapped positional shift of cross-frequency noise relative to voxel of origin. Broadband excitation with coded readout gradient strengths and magnitudes can be used with a frequency filter-bank to capture signal that can then be decoded for reduced cross-frequency noise. As in the first method, the use of narrowband reception will also cause spectral separation, permitting the advantages of increased SNR described earlier for spectral separation.

Aspects of CRISP Narrowband Filters

The frequency profile of each narrowband CRISP data channel is adjustable by changing filter profiles of the corresponding filters to each data channel. Nominally, this frequency profile is identical for each narrowband data channel and would be an ideal rectangular function in frequency, variable only in center frequency for each narrowband data channel. If general characteristics of the input broadband signal are known, however, it may be desirable to vary the shape, center frequency, and width of the frequency profiles of each CRISP data channel. Consider the case of a filter-bank with channels configured to be true square-wave spectral bandpasses that are perfectly juxtaposed. This situation is perfectly matched to the situation where the incoming spectral power distribution is flat. Any broadening of the channel filters will cause an increase in the number of admitted Fourier components, which will decrease the efficacy of SNR improvement by the multi-channel CRISP system (both by reducing cross-frequency noise and by reducing signal separation effects).

More realistically, the incoming distribution of spectral power is not completely flat, but is distributed according to a pattern dictated by the image signal intensity distribution and the strategy for encoding the radiation from the affected volume. For a given spectral power distribution, the sequence of filter bandpasses can be configured to produce optimal SNR in the Fourier domain or Inverse Fourier Domain. For example, if the final image is of a discrete object, the Fourier description of that object has most of the energy located in the lower order spatial frequencies. If, as is the case in MRI, the Fourier Transform is the actual signal that is collected, then it may be more judicious to divide lower order acquired data into more narrowband data channels than higher order acquired data, in order to more optimally remove cross-frequency noise contributions. Balancing this, in order to improve the effects of spectral separation, which benefits higher order acquired data more than lower order acquired data, it may be judicious to divide higher order acquired data into more narrowband channels than lower order acquired data. Optimal solutions may be reached based on this balance.

Step 2: Channel-Specific Data Sampling

Data sampling involves the conversion of an analog signal to a digital signal. Data sampling involves the use of A/D converter(s), which are well known in the art, and in the usual case of analog electronic to digital electronic signal conversion, take an analog electronic signal as input and provide a digitized electronic signal as output.

Within a multi-channel CRISP system, analog signals are digitally sampled within each CRISP data channel, separate from sampling in other CRISP data channels. This data sampling is performed using A/D converter(s), with either one channel per A/D converter, or multiplexed so that more than one channel shares an A/D converter. The minimum sampling rate requirements for each CRISP data channel will be dependent on that CRISP data channel's particular narrow bandwidth, and not on the overall broadband frequency range.

There is an effect introduced to the detected signal by the A/D converter which results in a type of noise called digitization noise. In cases where signal is low, this digitization noise can be an important noise source. Spectral separation, as is the case in CRISP, causes prolonged duration of signal above the noise floor. In cases of inherently low signal, the effect of this digitization noise is reduced. This effect would be noticeable in improving the SNR in collected data regarding higher-spatial frequency components of the resulting transformed Fourier signal profile or for targets with inherently low signal.

A specific example of this effect is described with respect to FIG. 6B. As shown in FIG. 6B, by using the systems and methods described herein digitization noise is reduced. The plot of FIG. 6B shows the relative ratio of SNR of a 10 channel embodiment of the invention relative to a conventional non-CRISP system (vertical axis) as a function of the number of bits used to digitize the signal (horizontal axis). This provides a measure of digitization noise and digitization noise improvement by CRISP. At a small number of digitization bits (<5), the improvement is relatively small but it quickly increases to a 10× factor and stabilizes at that level.

In addition, as shown in FIG. 6C, the plot shows the SNR ratio of a system implementing the techniques and devices described herein relative to a non-CRISP system (vertical axis) with a varying number of CRISP channels in the case of digitization-noise limited signal. From the figure, it is clear that the SNR improvement scales linearly with the number of channels in the CRISP system.

Typically, when a band-limited signal is sampled, the Nyquist-Shannon Theorem requires a sampling interval smaller than two per bandwidth. In the case where no a priori information exists regarding the frequency range spanned by the data, the restricted Nyquist-Shannon Theorem requires sampling intervals smaller than two per highest frequency. For instance, a signal would need to be sampled at a minimum sampling frequency of 2·B in order to maintain full signal information for signals with frequencies from 0 through B. In standard practice in the real world, signals are often filtered to maximum frequency B prior to sampling at a frequency of 2·B to prevent undesirable signal above maximum frequency B from aliasing into the sampled data.

It is important to note that if the signal to be sampled is band-limited, the minimum sampling frequency, as indicated by the Nyquist-Shannon Theorem, is not 2·B. Consider a broadband signal with bandwidth $\Delta f$ Using the Nyquist-Shannon Theorem, the minimal sampling rate is frequency $2 \cdot \Delta f$.

In a multi-channel CRISP system, however, multiple, separate, narrowband data (N channels) are created either by multi-channel narrowband filtration of the broadband signal or direct detection of narrowband signal. Each set of narrowband data has a narrow bandwidth $\delta f$ and the corresponding minimal sampling rate by the Nyquist-Shannon Theorem to avoid aliasing is $2 \cdot \delta f = 2 \cdot \Delta f/N$. That is, complete preservation of narrowband information can be maintained by a minimal sampling rate of $2 \cdot \Delta f/N$.

Thus, an important and interesting feature of a multi-channel CRISP system is that it has a relaxed minimum sampling rate requirement by a factor N compared to the nominal Nyquist-Shannon sampling rate. This means that significantly less data needs to be collected in each data channel per unit of time to satisfy Nyquist-Shannon sampling rate requirements, significantly reducing nominal acquisition time. The savings in time may be further used to increase SNR by taking further data.

It is also important to note that it is possible that the narrowband CRISP data channels will have different bandwidths, as outlined earlier. In this case, the minimum sampling rate requirements for each channel may vary. While it can be efficient to choose a single sampling rate that would comply with the most stringent of these requirements, it may sometimes be more efficacious instead to permit variability in sampling rates between channels.

Step 3: Channel-Specific Data Reconstruction

Within a multi-channel CRISP system, data is reconstructed or transformed within each data channel without information from other data channels. This isolates each data channel from each other, and prevents cross-frequency noise contribution between data channels.

Nominally, the main reconstruction algorithm is an FT or IFT, and would be preferentially performed directly without using the FFT algorithm, as the FFT imposes no a priori constraints on the frequency distribution of the input signal. If the signal is known to be band-limited, as in the case with CRISP, a more complex algorithm such as a Bayesian technique can be employed to more optimally perform the FT or IFT. With a multi-channel CRISP system with large N (number of narrowband channels), the number of frequencies within each channel is very small. In this case, a direct FT or direct IFT of the data may be more computationally inexpensive than the FFT method. In the maximal multi-channel CRISP system called SUPER-CRISP, also described later in the MRI section, only a single spectral component is present, and any method of spectral inversion will be able to solve for the intensity of the single detected sinusoid per channel with high accuracy. Specifically, with SUPER-CRISP, only a few measurements per channel would be needed. In this case, the method of transformation becomes significantly less relevant. Data reconstruction may be performed by software (computer program) or hardware (dedicated digital signal processing circuits).

Step 4: Data Recombination into an Image or Signal Profile

Recombination of all of the reconstructed data is then performed at the end. This may be a delayed recombination depending on what type of signal excitation (broadband or narrowband) technique was used. Regardless, collection of all required data would be finished at some point.

The manner of the recombination would depend upon the type of transformation/reconstruction that was used. Nominally, if FT/IFT were used for transformation, simple summation or concatenation of data can be performed. Since FT/IFT data reconstruction encodes position to frequency and vice versa, the output of narrowband CRISP data channels may be concatenated according to the specific narrowband frequency ranges involved. This operation may also be considered a summation, if one assumes that most of the data output would be zero except for data points that correspond to each particular narrowband CRISP data channel. The result is an image or signal profile. This step may also be implemented either in software or in hardware.

Certainly, in the simplest case, all (or a subset thereof) frequency-unmatched noise regions in the data from each narrowband CRISP data channel may be zeroed prior to data recombination. In circumstances where there may be a weighted noise effect so that noise may be associated with a weighted amount of signal at each frequency, then an appropriate weighting of the noise rather than a zeroing is performed in one embodiment, followed by summation.

Multi-Channel CRISP: Gain in SNR by Reducing Cross-Frequency Noise

Within a multi-channel CRISP system, by separating the input signal into multiple narrowband data channels that are reconstructed separately, cross-frequency noise between narrowband data channels is reduced nominally to zero. Increasing the number of narrowband data channels has a commensurate effect in reducing cross-frequency noise. Maximum reduction of cross-frequency noise occurs when the number of channels is equivalent to the number of pixel elements in the reconstructed image or signal profile (SUPER-CRISP).

A multi-channel CRISP system, therefore, greatly improves SNR in the final reconstructed (e.g. Fourier transformed) data, without additional acquisition time. For example, consider an input signal with total bandwidth $\Delta f$ and a CRISP system with N data channels, each with narrow bandwidth $\delta f$ (where $\Delta f = N \cdot \delta f$). Cross-frequency noise is not the only source of noise within any system, but if the noise in the detection process depends on the bandwidth (as is the case with many systems), the integration time required by the CRISP system to achieve a given image SNR is a factor $N^x$ less than in the conventional case, where $x=1$ in the case where the noise scales linearly with the bandwidth, and $x=0$ where the noise is independent of bandwidth. In the former case, full benefit is achieved with the CRISP method over conventional methods, and in the latter case, no benefit is achieved. In the latter case, the noise power scales as $\sqrt{}$bandwidth, and so a SNR gain of $\sqrt{N}$ is achieved by filtering out the cross-frequency noise. In other words, the noise on the detector decreased when the bandwidth in decreased, and so a smaller amount of noise is applied to a smaller range of frequencies.

In the case where cross-frequency noise dominates other noise in the final reconstruction, the expected improvement in SNR using a multi-channel CRISP system with N narrowband data channels would be close to $\sqrt{N}$. A 64-channel CRISP system would have a maximum SNR improvement of a factor of 8. Similarly, a 256-channel CRISP system would have a maximum SNR improvement of a factor of 16.

Multi-Channel CRISP: Gain in SNR by Spectral Separation Effects

As mentioned earlier, an important added benefit of spectral separation into narrowband data channels is the lengthening of the time of signal decay in each data channel so that there is an increased time period to sample data prior to reaching the noise floor. This added time for sampling increases signal-to-noise (SNR) especially for (1) signal that typically decays quickly, (2) targets with inherently low signal, and (3) signal profiles with high spatial frequency components. This is due to the effect of averaging two types of noise: random noise and digitization noise. This latter effect would be more pronounced for low signal circumstances where digitization noise would be prominent relative to the actual signal.

With increased spectral separation, digitization noise in the image decreases linearly. Accordingly, if the noise in an image is dominated by the digitization noise, it is possible to see a SNR increase equal to the number of narrowband channels. A CRISP system with 16 channels would see a 16-fold increase in the output image SNR in that circumstance.

Multi-Channel CRISP in Single Channel Mode

A multi-channel CRISP system can be used to collect data serially from small areas of the target with only one or a few channels being used at any one time. Ideally, narrowband signal is excited so that it corresponds to a narrowband CRISP data channel, such that received data passes efficiently through that particular channel. Narrowband excitation ensures that sub-parts of the target signal are received at any one time, so that frequency-matched signal and noise may be received without cross-frequency noise from other sub-parts of the target.

In this mode, the CRISP benefits of increasing SNR by the two effects of reducing cross-frequency noise and by spectral separation effects are still maintained. Numerous combinations of narrowband signal excitation (and reception) may be obtained.

For example, narrowband signal excitation may be performed sequentially so that adjacent strips of tissue can be excited in a serial manner or excited in an interleaved fashion to avoid cross-talk of signal excitation.

Single Channel CRISP

Alternatively, a single-channel CRISP system can be made. In this case, the single channel in single-channel CRISP is identical to any of the channels in multi-channel CRISP with the exception of center frequency. This center frequency may itself be adjusted during imaging or instead, incoming signal may be appropriately mixed to a fixed center frequency for the channel.

As in the case of multi-channel CRISP in single channel mode, strict attention to data acquisition, data reconstruction, and data recombination must be performed so that cross-frequency noise is deliberately and consistently reduced. An additional effect of spectral separation will be had by the use of a single narrowband system.

Section Two: Introduction to Exemplary Wave-Based Data Acquisition Systems

Conventional MRI/MRS

In the fields of MRI, MRS, and MRSI, all based on NMR, certain nuclei with a net magnetic moment are placed within relatively homogeneous applied magnetic fields and are disturbed from thermodynamic equilibrium using electromagnetic waves at the Larmor frequencies of the nuclei (typically at radio frequencies (RF)). As relaxation occurs back to thermodynamic equilibrium, there is emission of RF waves at the same Larmor frequencies. These RF waves are detected using RF antenna(e) or coils, sampled, and stored. An Inverse Fourier Transform (IFT) is performed on the sampled data to provide a final image (in the case of MRI) or signal profile (in the case of MRS).

In MRI, data is collected during the assertion of a linear magnetic gradient or combination of linear magnetic gradients to achieve spatial localization of RF signal. Data that is collected in this manner represents data collection and traversal in the state-space of the spin system in MRI; this state-space is also called k-space, and represents the Fourier Transform of the final MRI image(s). In the nominal case, rectilinear collection of data in k-space is performed with each line in k-space acquired after a single RF excitation. In the case of standard echo-planar imaging (EPI), an entire rectilinear data set in k-space is collected after a single RF excitation. Non-rectilinear data collection pathways may also be used, including projection reconstruction imaging (which acquires data in linear radial arms from the k-space center), and spiral imaging (which acquires data in spiral arms from the k-space center), among others. Many different k-space trajectories may be used and have been described. In all cases in MRI, data is collected during the assertion of a linear magnetic gradient or combination of linear magnetic gradients.

In MRI, as a result, acquired data consists of a broadband of free induction decay (FID) signals at numerous varying Larmor frequencies associated with the local magnetic environment of the nuclei that are being imaged, and the combination of the applied main magnetic field and the superimposed magnetic fields of asserted linear magnetic gradients.

In MRS, data is not collected during the assertion of a linear magnetic gradient, but due to the higher frequency resolution requirements, acquired data also consists of a relatively broadband of FID signals at varying Larmor frequencies associated with the local magnetic environment of the nuclei that are being imaged and the applied main magnetic field. These kinds of signals are also present under MRI conditions, but are less spectrally resolved due to technical factors.

MRSI may be considered a combination of MRI and MRS, whereby data is collected during the assertion of a linear magnetic gradient, and also divided further by the high spectral resolution of signal within each pixel. For the purposes of brevity, application to MRSI is assumed if an application to MRI or MRS is described in this present document.

In the case of MRI and MRS, after data collection, an Inverse Fourier Transform (IFT) is performed, invariably using a Fast Fourier Transform (FFT) algorithm. The FFT algorithm is a very common technique used in many fields and applications that efficiently calculates a Fourier Transform or Inverse Fourier Transform of a $2^M$ data length in time $M \log(M)$ rather than $M^2$. In the case of MRI, an image representation of the signal amplitude and signal phase relative to position is obtained by the IFT, whereas in the case of MRS, a profile of signal amplitude and signal phase relative to frequency offset from the center Larmor frequency is obtained.

Specifically, in MRI, it is now common to use parallel data acquisition and reconstruction in the phase encoding direction, primarily during rectilinear k-space data acquisition, under the general term "parallel MRI". Many such techniques have been described in the field using names such as SENSE, SMASH, PILS, GRAPPA, SPACE-RIP, SEA, among others. Such techniques consist of using multiple spatially targeted RF coils, each with limited spatial coverage. The sensitivity of each coil can be determined, and contributions of MR signal from other regions of the body other than from each coil itself can be eliminated mathematically. Since data is being received in parallel from these different targeted regions, a reduced number of phase encoding steps may be performed resulting in a shorter overall scan time. In this circumstance, there is also an associated reduction in signal-to-noise ratio (SNR) using parallel MRI. Alternatively, a high number of phase encoding steps may be retained, resulting in a high spatial resolution scan with large field of view (FOV) coverage for the same scan time, albeit with an attendant small parasitic SNR loss compared to a nominal non-parallel MRI scan.

Cross-Frequency Noise in Conventional MRI/MRS

Signal Collection: Each MRI and MRS signal is composed of many different frequency components, and can be considered a broadband signal for the purposes of description in this document. In MRI, the signal is received during the assertion(s) of linear magnetic gradients during what is known as the readout. In MRS, a higher frequency resolution examination is performed on the signal without the use of imposed linear magnetic gradients, eliciting differences in resonance frequencies due to specific physical chemistries of molecules; acquisition of the spectral data can also be considered the equivalent of the readout in MRI.

Signal collection is performed with the use of a tuned RF coil. The collected RF waves are thus converted into an electrical signal in the coil output. In the case of either MRI or MRS, each frequency component i can be considered a sinusoidal signal $S_i$ with its own associated noise component $N_i$. The combination of all frequency components ($S_i$ and $N_i$) and the addition of other sources of noise comprise the single broadband input waveform $X_{total}$ that comes from MRI/MRS RF coils for sampling. Conversely, the single input waveform $X_{total}$ is the sum of a total signal $S_{total}$ and a total noise $N_{total}$ (i.e. $X_{total}=S_{total}+N_{total}$), where $S_{total}$ is the sum of all MRI or MRS signal that the RF coil(s) receive, and where $N_{total}$ is the total noise, comprised of the noise of all frequency components, coil noise, as well as electronic noise.

Receiver/Detector: After signal collection, the electrical input waveform is sent to a receiver for mixing, filtration, and sampling. Data sampling is performed by analog-to-digital conversion at a sampling rate at least equal to the Nyquist-Shannon sampling rate limit.

Transformation: In conventional MRI or MRS, an IFT is performed on the received single input waveform using an FFT algorithm to create waveform $Y_{total}$. Ignoring relaxation effects, each calculated data point in the IFT-FFT waveform $Y_{total}$ is an amplitude and phase representation of the corresponding frequency component of single input waveform $X_{total}$.

Noise: An important feature of this conventional for MRI and MRS is that the total noise $N_{total}$ of the single input waveform $X_{total}$, contributes to every calculated data point of $Y_{total}$. Therefore, each data point in the final reconstructed image or signal profile data has significant cross-frequency noise contributions.

Put another way, for each voxel, the sample signal is at a signal position of the transformed data, but the noise from that sample contributes to every point in the transformed data space in addition to the signal position. The transformed noise at the non-signal positions from the voxel is a type of cross-frequency noise. As mentioned previously, once the presence of cross-frequency noise is understood, NMR-based methods to reduce cross-frequency noise may then be developed such as described in the following sections.

Multi-Channel CRISP MRI System

A description of a multi-channel multi-frequency processing method for MRI/MRS/MRSI, such as a CRISP method, follows below. As in the general invention described in this document, a similar set of characteristic steps is present. This multi-channel CRISP MRI/MRS/MRSI system has an analog front-end consisting of (1) tuned RF hardware, (2) a frequency filter-bank (or equivalent), or (3) a combination of (1) and (2), in order to create separate narrowband data channels. Data within each channel is sampled separately. In the digital back-end, data is then reconstructed separately, and then recombined into an image or image/signal profile.

This system is used in concert with broadband or narrowband signal excitation depending on the circumstance. Additionally, the use of various gradient encoding schemes may map cross-frequency noise to different locations such that the noise may be calculated out of collected data. That is, gradients will map specific cross-frequency noise to different locations relative to the source pixel location. Methods can be developed to encode cross-frequency noise to certain positions by the use of gradients in sequential imaging such that cross-frequency noise may be calculated out from affected pixels of the final image.

Step 1: Division of Input Signal into Multiple Data Channels: Tuned RF Hardware

In the case of tuned RF hardware, there are many embodiments. In each case, data from each hardware channel is sampled, then reconstructed (IFT), then re-combined with (e.g. added to) other data from other hardware channels, nominally by addition (explained later in this section). Reconstruction and recombination can be performed using a programmable computer and/or dedicated hardware.

Multiple coils or antennae are spatially placed so that full coverage of the target material is obtained by the sensitivity regions of each coil/antenna. The data received from each coil is separately sampled and reconstructed in separate narrowband data channels. Data recombination with the outputs of other data channels occurs at the end. The location of the coils or antennae can be arbitrary. In the case of parallel imaging, the coils are laid out parallel in a phase encoding direction. If the coils are laid out parallel in the frequency encoding direction, a form of parallel imaging in the readout direction occurs. In the case of radial acquisitions, radially oriented coils also create a form of parallel imaging in the readout direction. In all cases, coils or antennae are specifically tuned to different spatial regions of the target volume.

In one embodiment of the tuned RF hardware, moving coils or antennae are used. In yet another embodiment, low-noise detectors such as superconducting RF coils or low-temperature RF coils can be used in any of the embodiment scenarios described above.

Examples of Tuned RF Hardware

In one tuned RF hardware embodiment, nested coils are overlaid on top of each other, with each coil tuned to a separate narrowband of RF frequencies. The total spectral coverage of the coils is equivalent to the desired broadband coverage of the target tissue or sample. The spatial coverage of each coil is the entire target tissue or sample. This is a flexible system that permits the readout to be oriented in many different directions.

In another embodiment of tuned RF hardware, parallel RF antennae and/or coils are used in the frequency encoding direction. Each RF antennae/coil would feed into a single CRISP data channel. This type of physical configuration is suitable for rectilinear MRI acquisitions.

In another embodiment of tuned RF hardware, rotating parallel RF antennae and/or coils are used with constant or variable speed. Each RF antennae/coil would feed into a single CRISP data channel. This type of physical configuration is suitable for radially symmetric MRI acquisitions.

In yet another embodiment of the tuned RF hardware, concentrically placed RF coils are used. This type of configuration may be suitable for radially symmetric acquisitions as the assertion of radially symmetric linear gradients would cause each RF coil to receive an appropriate narrowband of RF signal. Selective blocking and unblocking of RF coils is necessary.

In yet another embodiment of the tuned RF hardware, radially symmetric RF antennae and/or coils are used. This configuration would allow narrowband decomposition for each RF antennae separately; the RF signal from each antenna would undergo narrowband decomposition, such as with a frequency filter-bank. Acquisition of signal from a radial line of RF antennae and/or coils is obtained during the assertion of a linear gradient in that direction. The direction of the linear gradient rotates with time.

In yet another embodiment of the tuned RF hardware, a combination of phase encoding and frequency encoding direction coils and/or antennae are used such that selective RF excitation and reception can be performed in a grid-like fashion. This kind of system may be used for excitation and tracking of moving tissue, for example.

In yet another embodiment of the tuned RF hardware, a combination of the concentric and radially symmetric RF antennae and/or coils is used. Selective RF excitation and reception may also be performed. This kind of system could also be used for excitation and tracking of moving tissue, for example.

In another embodiment of the tuned RF hardware, coils undergoing rotating translational movement or other motion are used. In yet another embodiment of the tuned RF hardware, rotating antennae are used. For example, multiple parallel antennae are aligned in one direction. Perpendicular to this direction is the readout direction for a rectilinear MRI k-space acquisition. Alternatively, as the antennae rotate, the readout direction indicated by the antennae is the direction of gradient application in a radially symmetric k-space acquisition.

Step 1: Division of Input Signal into Multiple Data Channels: Frequency Filter-Bank Hardware In the case of a frequency filter-bank, signal from a broadband signal collector is fed into a frequency filter-bank or equivalent, with the output going into multiple, separate narrowband data channels. This can occur before or after mixing of the collected signal to a lower base frequency. The latter case is preferred as it does not require mixing circuitry for every data channel, but this does not preclude the use of the former.

Frequency filter-banks take an incoming signal and filter the signal into multiple, separate, narrowband signals prior to sampling. In one embodiment, the filter bank includes a common signal receiving bus adapted to receive a composite signal; a plurality of isolated output buses; and a frequency filter module. This frequency filter module includes a plurality of bandpass filter elements, wherein the filter elements each include an input and an output, each of the inputs in electrical communication with the common signal receiving bus, each of the outputs in electrical communication with one of the plurality of isolated output buses, the outputs electrically isolated from the other outputs and each of the inputs.

In the simplest case, the filters are not adjustable, and are defined by their number, center frequency and bandwidth. In the more ideal case, the filters that are used are modifiable, including shape, bandwidth, and center frequency. These filters may be modified digitally or by circuitry. The advantage of the frequency filter-banks approach is that it is compatible with many different coil and/or antennae designs. The broadband signal from standard RF coils is sent to a frequency filter-bank, the outputs of which each represent multiple, separate narrowband data channels. These outputs are then data sampled.

The frequency filter-bank does not reduce cross-frequency noise alone and must be integrated with pulse sequences that do selective excitation or with variable magnetic field gradient fields that would change the mapped location of voxel noise relative to signal location in order to reduce cross-frequency noise, among some possibilities. The frequency filter-bank however does inherently perform spectral separation and the added SNR effects of spectral separation are applicable.

Step 1: Division of Input Signal into Multiple Data Channels: Combination Tuned RF and Filter-Bank Hardware In another embodiment, a separate frequency filter-bank is attached to a separate RF coil or antenna used in MRI or MRS, as part of a multi-coil setup as described in the tuned RF hardware section.

In another embodiment, a separate frequency filter-bank is attached to each of a series of RF coils or antennae used in MRI or MRS.

In either case, the added SNR effects of spectral separation are valid with the use of frequency filter-banks. Additionally, if the combined coils with frequency filter-banks are used in concert with specific pulse sequences or gradient assertions, cross-frequency noise may also be reduced.

Step 2: Channel Specific Data Sampling

Data sampling is performed separately for each CRISP data channel. This may be performed with an A/D converter assigned to each channel or by multiplexing more than one channel per A/D converter.

A multi-channel CRISP system for MRI, like CRISP systems for other applications, can take advantage of the narrowband of frequencies within each channel to reduce Nyquist-Shannon sampling rate constraints. The time to collect enough data for imaging reduces by a factor of the number of channels N. Each channel represents a range of frequencies that corresponds to a certain range of locations in the imaged object. Physically, it represents a strip or slab of excited tissue. Thus, each data channel contains information about the comprising pixels (e.g. four pixels per channel) that can be determined more quickly. This also means that a further increase in sensitivity may be obtained for a given acquisition time; since the needed acquisition time is reduced, the "extra time" can be used for taking more data.

Step 3: Channel Specific Data Reconstruction

In a multi-channel CRISP MRI/MRS system, data reconstruction is performed separately on the data in each CRISP data channel. Nominally, this is performed with direct IFT.

Step 4: Data Recombination into Image or Signal Profile

After separate data reconstruction in each CRISP data channel, the data is recombined. The recombination can be tied to the way that data reconstruction is performed. The manner of this separation transfers the data from each data channel to the final image without introduction of cross-frequency noise from other data channels.

In this section, the separate cases of parallel imaging in the readout direction and parallel imaging in the phase encoding direction using the CRISP system specifically for cross-frequency noise reduction with secondary spectral separation benefits are described.

CRISP MRI in the Phase Encoding Direction

Consider a multi-channel CRISP system performing parallel imaging in the phase encoding direction. The purpose of the multi-channel CRISP system is to reduce cross-frequency noise along with receiving the other benefits of parallel imaging in the phase encoding direction such as decreased scan time. In this case, each narrowband CRISP data channel is collecting data from a parallel imaging channel. While it is commonly understood that parallel imaging in the phase encoding direction will cause a reduction in SNR, the use of a multi-channel CRISP system with parallel imaging in the phase encoding direction will add to the SNR by the reduction of cross-frequency noise.

Separate reconstruction of image data from each of these narrowband CRISP data channels must be performed in order to minimize cross-frequency noise between channels. Each set of image data from each CRISP data channel represents an intermediate image that has signal and frequency-matched noise in the appropriate spatial locations as per standard MRI spatial localization. The locations match the corresponding positions of each parallel imaging channel. All other locations will be zeroed. Performance of the reconstruction is best performed in a direct manner. That is, for each non-zero intermediate image position, the magnitude and phase are calculated with a direct IFT with the data from the narrowband CRISP data channel. The sum of all intermediate images would then correspond to the final MRI image, but with reduced cross-frequency noise between narrowband CRISP data channels.

This approach differs from routine non-CRISP parallel imaging in the phase encoding direction in that data reconstruction is separate for each data channel and that data recombination requires the zeroing of regions in each intermediate image that are not related to the corresponding narrowband CRISP data channel.

These specific actions reduce cross-frequency noise. It is can be the case that coil noise dominates image noise rather than sample noise, especially for low magnetic field strengths and for poorly designed RF coils. If these actions are ever performed without understanding the nature of cross-frequency noise (part of sample noise) and its origin as part of the imaging process, there may not be significant noise reduction enough to warrant further investigation. The use of a multi-channel CRISP system is directed directly at the reduction of cross-frequency noise in final MRI images and would have its best effect when cross-frequency noise dominates.

CRISP MRI in the Readout Direction

Now consider a multi-channel CRISP system performing parallel imaging in the readout direction. The actual readout direction is variable. For example, the readout direction may be radial in the case of a radial-symmetric k-space acquisition, or may be perpendicular to the phase encoding direction in the case of a rectilinear k-space acquisition.

At each point in k-space, the acquired data consists of a set of phase and amplitude measurements as a function of each channel, or more by inference, narrowband frequency. In this way, the CRISP process is adding a third dimension (frequency, maximum index N) to k-space (defined by the phase- and frequency-encoding directions).

In one embodiment, each narrowband CRISP data channel has an output of a number of data points which represent points in the final image. In MRI, position is encoded in the readout direction by frequency of precession. Thus, the data contained within a narrowband CRISP data channel corresponds to corresponding adjacent object positions. Data recombination in the nominal case simply involves concatenation of outputs from the various narrowband CRISP data channels, according to their corresponding object positions. If a 16-channel CRISP MRI system with 256 data point readout is used, each narrowband CRISP data channel outputs data for 16 data points in the final image. The operation of recombination can be considered addition, if each narrowband CRISP data channel can be considered to have a 256 data point output, most of the data points of which have zero value, except for the 16 data points that correspond to the particular narrowband CRISP data channel. A more specific description of image reconstruction follows.

CRISP MRI in the Readout Direction: 1D

Standard MRS scanning outputs are essentially 1-D signal profiles. After separate transformation in each CRISP narrowband data channel, the data from each channel is recombined into a signal profile. Since position is encoded by frequency, data recombination involves concatenation of outputs from the narrowband CRISP data channels according to their corresponding positions. This action may be considered summation if non-relevant frequency positions are zeroed in each channel output.

CRISP MRI in the Readout Direction: 2D and beyond

To explain how CRISP NMR image creation can be performed, first consider a standard NMR system that would be modified for image production. The collected data set can be described as k-space and that the final image is the IFT of the k-space data.

Assume the image and k-space matrices are each M×M pixels. After collection of an entire M×M k-space data matrix, a multi-dimensional IFT-FFT is performed on the data set, which is essentially equivalent to applying a 1D IFT-FFT in each spatial dimension. Direct calculation of the IFT could be performed, but is avoided due to computation requirements.

Figure 3A:
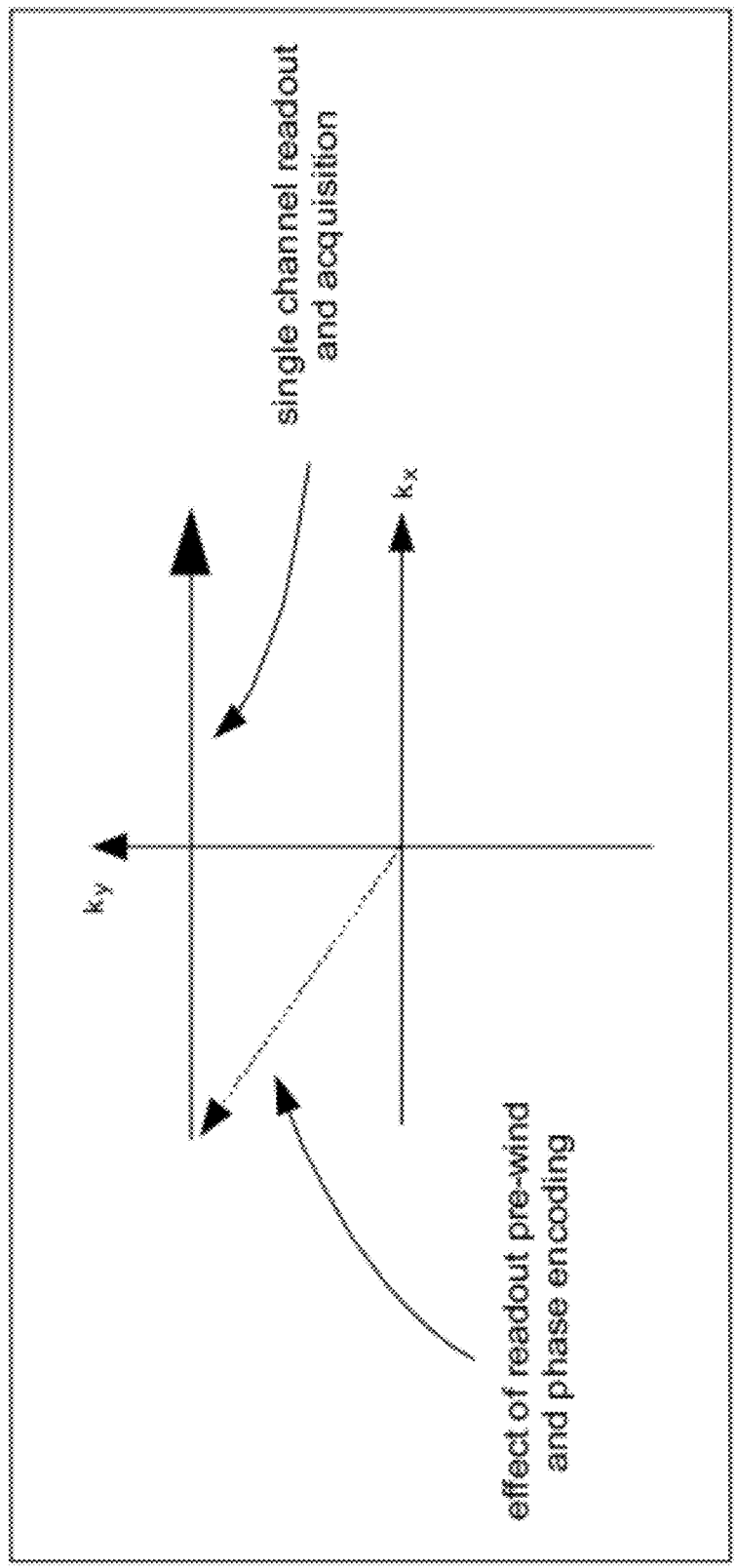
FIG. 3A shows a conventional k-space readout in a two dimensional rectilinear data acquisition system.
Figure 3B:
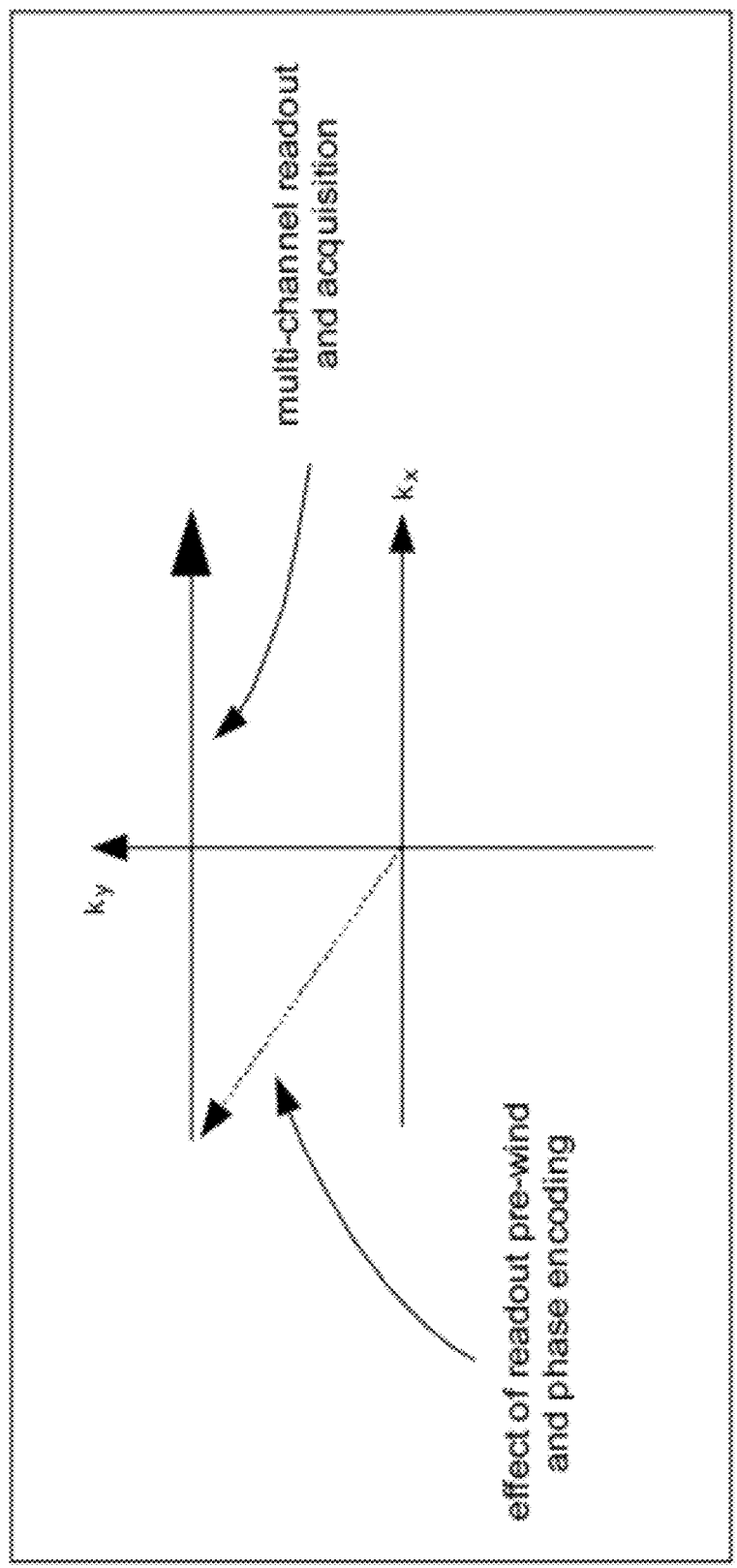
FIG. 3B shows a k-space readout in a two dimensional rectilinear data acquisition system according to an illustrative embodiment of the invention.
Figure 3C:
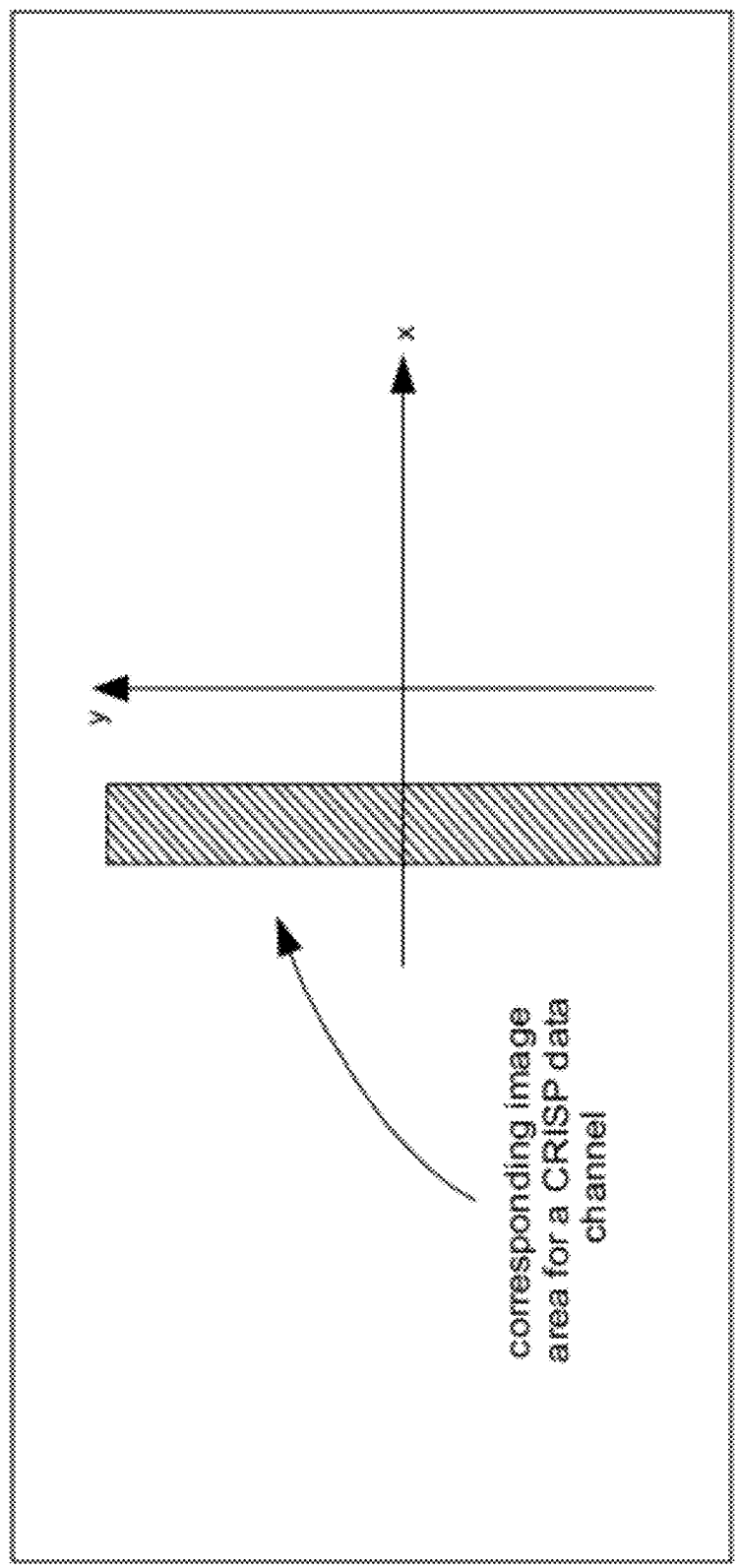
FIG. 3C shows an intermediate image calculation stage according to an illustrative embodiment of the invention.

Now consider an N-channel CRISP NMR system. In the case of a standard rectilinear k-space trajectory with standard phase ($k_y$ direction) and frequency encoding ($k_x$ direction), N narrowband channels of k-space data are simultaneously collected during each readout. After M phase encoding steps, data acquisition is complete. Reconstruction is performed with direct calculation of the IFT to maintain reduced cross-frequency noise levels. Direct IFT calculation requires understanding the relationship of the data within each CRISP channel to the final image. Specifically, data within each CRISP channel represents a vertically oriented rectangular strip of pixels measuring M/N×M pixels in the desired image (FIGS. 3A-3C). The leftmost strip would have an RFB value of 1 and the rightmost strip would have an RFB value of N. FIG. 3A depicts the k-space pathway of a single readout of a standard rectilinear k-space acquisition. As shown in FIG. 3A, each line of k-space that is collected involves a single readout channel. After acquisition of all of the desired data in k-space in a raster-like fashion, e.g. 256×256 data points, an IFT is performed to calculate the final image (also 256×256 data points).

In an N-channel CRISP imaging system, e.g. for MRI, the k-space pathway for each readout is not changed, but there are now N parallel readouts, one for each CRISP channel as shown in FIG. 3B. Further, with respect to FIG. 3B, each line of k-space that is collected involves multiple readout channels. If there are N channels, N complete sets of k-space are collected, one for each channel. This can be considered to be an added dimension to the acquired k-space data. After acquisition of all of the desired data in k-space in a raster-like fashion, an IFT is performed to calculate the final image.

The data from each CRISP channel corresponds to a rectangular strip of image data (FIG. 3C). Since there are N channels, and each rectangular strip of image data is M/N pixels in the short axis, this comprises the entire image data set, if a 2D image data set is considered. With respect to FIG. 3C, as shown an intermediate image calculation is performed using information from each data channel (such as a CRISP data channel). In the case of a raster scan, this forms a rectangular area.

There are at least two different methods to perform the direct IFT for a rectilinear k-space trajectory. First, the IFT value of each image pixel is directly determined by the Inverse Fourier contributions of data from the corresponding CRISP channel as indicated by the RFB value. Second, intermediate images from each of the k-space data points in the corresponding CRISP channel may be summed. Each intermediate image (M×M pixels) has zero-value pixels except for a corresponding non-zero rectangular strip (M/N×M pixels) with signal values describing a single spatially distributed sinusoid. For each rectangular strip, the sum of all of the intermediate images for each channel directly calculates the IFT. The sum of all IFTs from each channel is equivalent to a concatenation of the transformed data from each CRISP channel (putting the rectangular strips together). With either method, the IFTs of each of the CRISP channels (RFB=1 to N) is calculated while maintaining cross-frequency noise within each channel.

Now consider a radially symmetric k-space trajectory such for projection reconstruction NQR using CRISP NQR. Each readout trajectory runs linearly from the k-space origin to the k-space periphery. One method of reconstruction uses the Fourier central slice theorem. The Fourier central slice theorem indicates that the 1D IFT of each radial line in k-space represents a summation projection through the object in the perpendicular direction. Accordingly, the IFT calculation is for a 1D situation, as described in the previous section. The equivalent of filtered back-projection may be performed by multiplying the k-space data in each CRISP data channel by the appropriate filter weighting factors (many of which are zero) prior to back-projection in the image domain.

Another method of reconstructing projection reconstruction CRISP NMR is to use the intermediate image method described above for rectilinear k-space trajectories. In this case, the non-zero rectangular strips are located in the image perpendicular to the direction of the readout gradient, and at a location according to the corresponding CRISP data channel. The non-zero data values in each rectangular strip are calculated directly from the k-space data in the corresponding CRISP data channel to form an intermediate image. The final desired image may be created by summation of all intermediate images. Filtration may be performed preferentially on the k-space data by multiplication or on the final image by convolution.

For the general case of any k-space trajectory, N narrowband channels of k-space data are simultaneously collected during each readout. The intermediate image method described above may be generalized to any k-space trajectory by using the instantaneous tangent of the k-space trajectory to determine the location and rotation of each non-zero rectangular strip.

These concepts are not limited to two dimensions, and can be extended easily to multi-dimensional situations.

Multi-Channel CRISP MRI: Gain in SNR by Reducing Cross-Frequency Noise

The use of a multi-channel CRISP system with a high number of channels in either the phase encoding or the readout direction would substantially increase SNR from the nominal case. Accordingly, substantially better image quality or faster imaging may be obtained in MRI and greater detectability may be gained in both MRI and MRS.

Target noise (also called sample noise or patient noise) is commonly understood to dominate at routine clinical magnet strengths of 1.5 T. In high channel parallel imaging in the phase encoding direction, this relation is reduced as there is a relative loss of corresponding signal in each channel compared to the noise floor of data acquisition. The noise floor is made of coil noise, electronic noise, digitization noise, and sample noise (including cross-frequency noise). Methods to reduce the non-sample noise sources such as better coil design and low noise coils such as superconducting RF coils would only increase the dominance of sample noise (and thus cross-frequency noise). The use of a multi-channel CRISP system in this case would help to significantly reduce noise.

For example, when cross-frequency noise is the dominant noise, an N-channel CRISP MRI system, e.g. N=256 channels, would have up to $\sqrt{N}$ or 16 times more SNR than a conventional MRI system. Compared to a conventional MRI system performed on a 1.5 T magnet, this would be the equivalent of having the same SNR as from a 24 T magnet, but with no change in precessional frequencies or RF heat deposition constraints. This markedly increased SNR that a multi-channel CRISP system translates to overall higher sensitivity for MRS and MRI, higher spatial resolution for MRI, and faster imaging for MRI.

Multi-Channel CRISP MRI: Gain in SNR by Signal Separation

As mentioned earlier, an important added benefit of spectral separation into narrowband data channels is the lengthening of the time of signal decay in each data channel so that there is an increased time period to sample data prior to reaching the noise floor. This added time for sampling increases signal-to-noise (SNR) especially for (1) signal that typically decays quickly, (2) targets with inherently low signal, and (3) signal profiles with high spatial frequency components. This is due to the effect of averaging two types of noise: random noise and digitization noise. This latter effect would be more pronounced for low signal circumstances where digitization noise would be prominent relative to the actual signal. With increased spectral separation, digitization noise decreases linearly. Accordingly, if the noise in an image is dominated by the digitization noise, it is possible to see an SNR increase equal to the number of narrowband channels. A CRISP MRI system with 16 channels would see a 16-fold increase in the output MRI image SNR in that circumstance. Details relating to the effects of spectral separation are also discussed above with respect to FIGS. 6A-6C.

CRISP MRI in the Readout Direction: Gradient Encoding of Cross-Frequency Noise

Cross-frequency noise is the sample noise from a voxel that has frequencies that overlaps with the signal frequencies of other voxels. Not all of this cross-frequency noise would be random, and may be conditioned by certain microscopic effects including hydration shells around proteins, semisolid, and solid material noise distribution effects. As such, the displacement of this cross-frequency noise may be affected to some degree by the size of readout gradients, and therefore can be manipulated relative to desired signals so that these non-random portions may be algebraically removed or reduced from several acquisitions with different gradient strengths.

For example, a certain gradient strength will displace certain cross-frequency noise at a certain away from a voxel's position in the image. The reverse or negative of this gradient strength will displace such cross-frequency noise at the same distance from the voxel's position in the image but in the opposite direction.

Multi-Channel CRISP MRI: Single Channel Mode

Selective excitation of tissue can be integrated into a multi-channel CRISP MRI system. Specifically, strips of tissue are excited with their long axis perpendicular to the readout direction. Either a multi-coil, multi-channel CRISP MRI system, or a single coil, multi-channel frequency-bank CRISP MRI system may be used with this type of selective excitation. The selective excitation should be performed optimally to match the parameters of specific narrowband CRISP data channels.

Numerous combinations of excitation of narrowband signal may be obtained. In its simplest form, a single strip of tissue is excited and received at a time, using a single narrowband CRISP data channel at a time. A nominal situation may be a pulse sequence that would excite bands of tissue in the readout direction in a serial pulsed manner. The received data would each go through a corresponding narrowband CRISP data channel, and finally, data reconstruction and data recombination would be performed in a manner to reduce cross-frequency noise. The use of narrowband data channels is enough to also create signal separation effects as described earlier.

Single Channel CRISP MRI

Alternatively, a single narrowband CRISP system can be made focusing on the two effects of increasing SNR: by reducing cross-frequency noise, and by signal separation effects. In this case, a single narrowband CRISP data channel using a narrowband filter rather than a narrowband tuned RF coil is best used.

In the nominal case, a pulse sequence would excite bands of tissue in the readout direction in a serial pulsed manner. The received data would each go through the single narrowband CRISP data channel, and each time, would either be mixed down to the center frequency of the data channel, or the center frequency of the data channel would be changed to the center frequency of the received data. Data reconstruction and data recombination would occur in a similar manner to other CRISP manifestations.

Multi-Channel CRISP for MRI/MRS: Computer Simulation

To demonstrate the SNR gains that are possible with a multi-channel CRISP system for MR imaging, a computer simulation was created. The simulation has been implemented for the cases of a conventional non-CRISP MRI system and a multi-channel CRISP MRI system (128 channels).

The simulation begins with an ideal noiseless image of a human head. From this, a computer-base system synthesizes the corresponding k-space data by Fourier Transform. Noise is then added according to two different situations: conventional non-CRISP and 128-channel CRISP MRI. The detected k-space noise is assumed to be proportional to the square-root of the receiver bandwidth. An Inverse Fourier Transform is then performed to obtain the final images that would result from a conventional non-CRISP implementation versus a 128-channel CRISP MRI implementation.

Figure 2C:
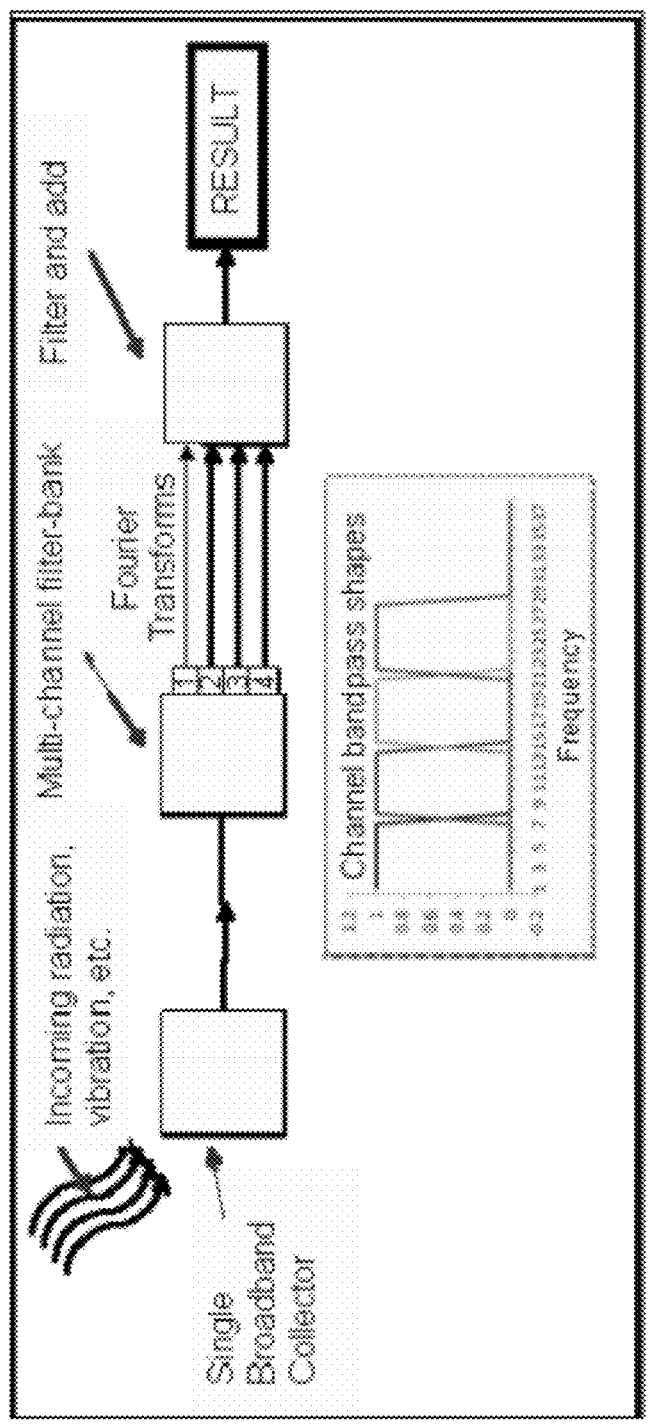
FIG. 2C shows a signal detection system that uses a single broadband collector according to an illustrative embodiment of the invention.
Figures 2, 2D:
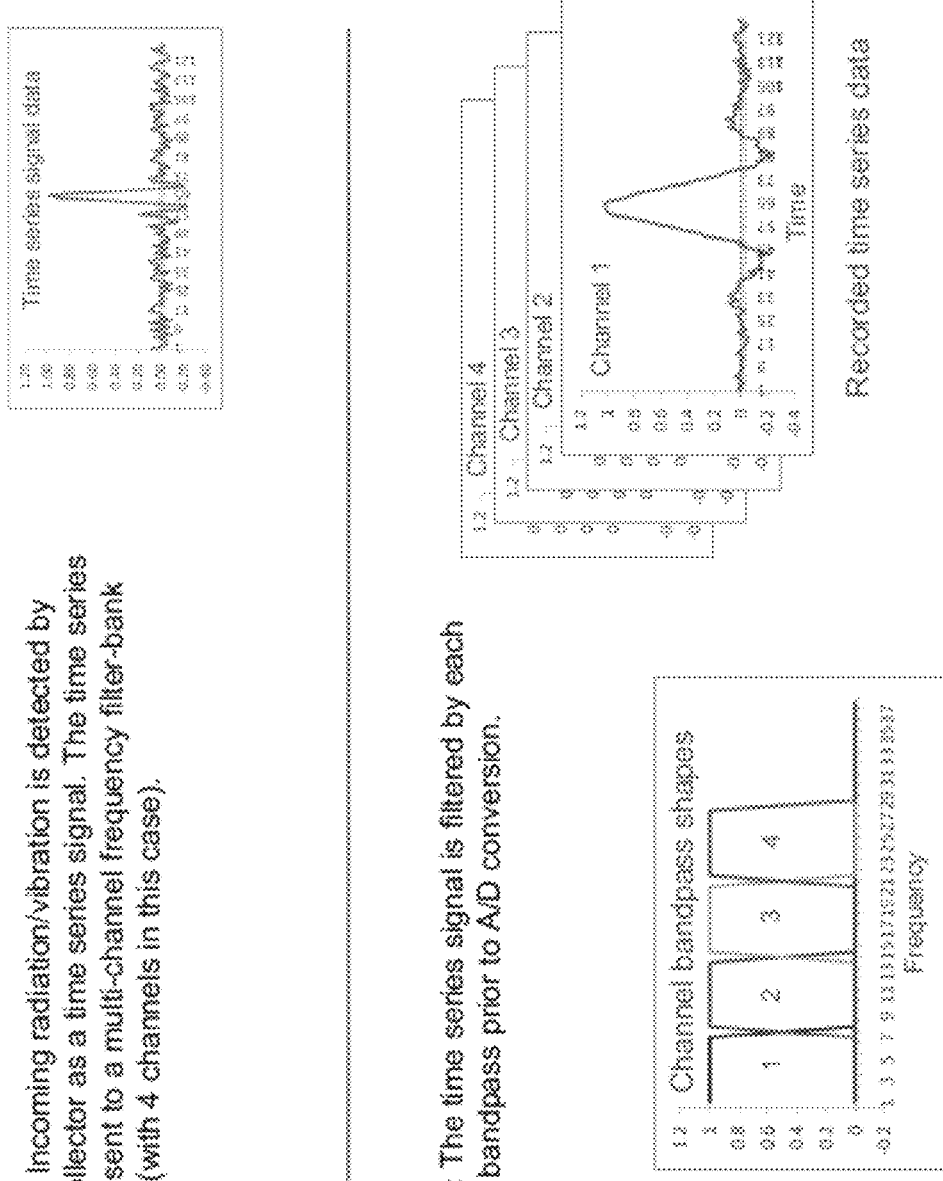
Figure 4:
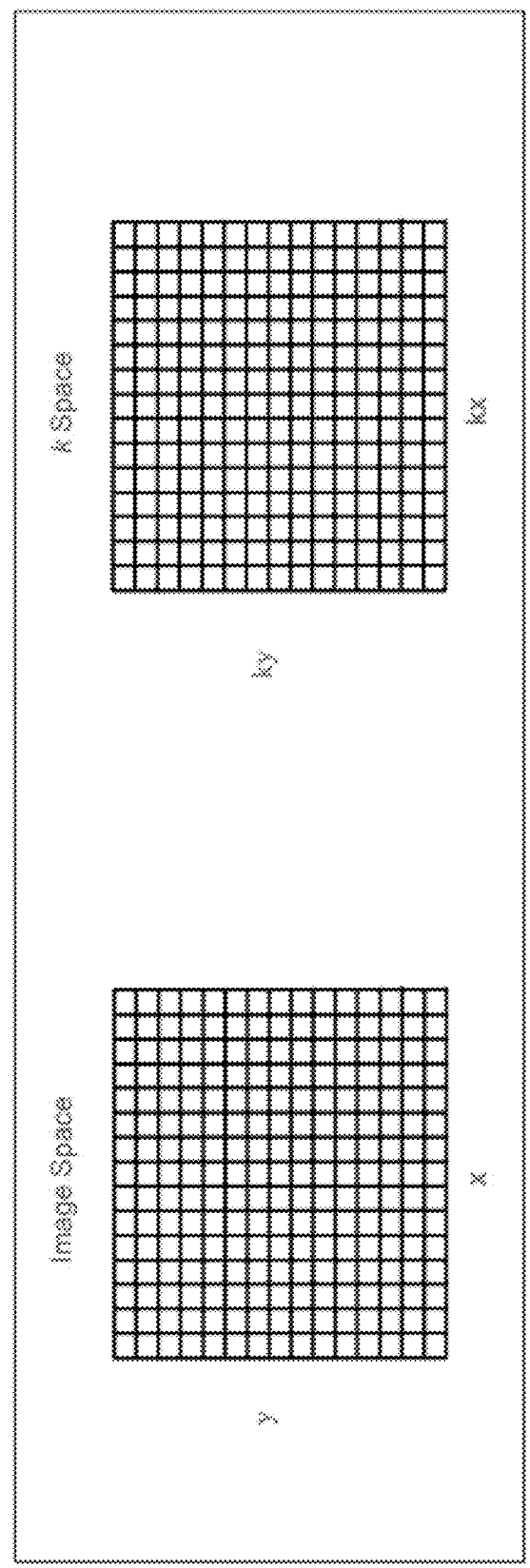
FIG. 4 shows the geometry of computer simulations suitable for use in an embodiment of the invention.

The generalized path for the simulation is shown in FIGS. 2C and 2D-1, and others, for the case of a single broadband collector, and a series of narrowband detectors each tuned to a separate frequency. In one embodiment, the series of narrowband detectors are each tuned to an independent central frequency. From the standpoint of the simulation, both situations are equivalent and result in identical simulated images. The specific geometry of this situation is shown in FIG. 4. The following method was used:

1. Start with a 2-dimensional, model (i.e. noiseless) image brightness distribution, $I_m(x_i, y_j)$, consisting of a single slice of biological material. Here, $x_i, y_j$ are the image coordinates.

2. Compute the Fourier transform of the model image, resulting in the model (i.e. noiseless) k-space complex data, $I'_m(kx_p, ky_q)$ for the non-CRISP case, and $I'_m(kx_p, ky_q, f_k)$ for the CRISP implementation. Here, $kx_p$ and $ky_q$ are the k-space coordinates, and $f_k$ is the frequency of the $k^{th}$ channel.

3. Synthesize the detected k-space data, $I'_d(kx_p, ky_q)$ or $I'_d(kx_p, ky_q, f_k)$ for the non-CRISP and CRISP cases, respectively, by adding noise proportional to the detector bandwidth to the model k-space data.

4. Compute the inverse Fourier transform of the synthesized k-space data to reconstruct the synthesized image data, $I_d(x_i, y_j)$.

Figure 5:
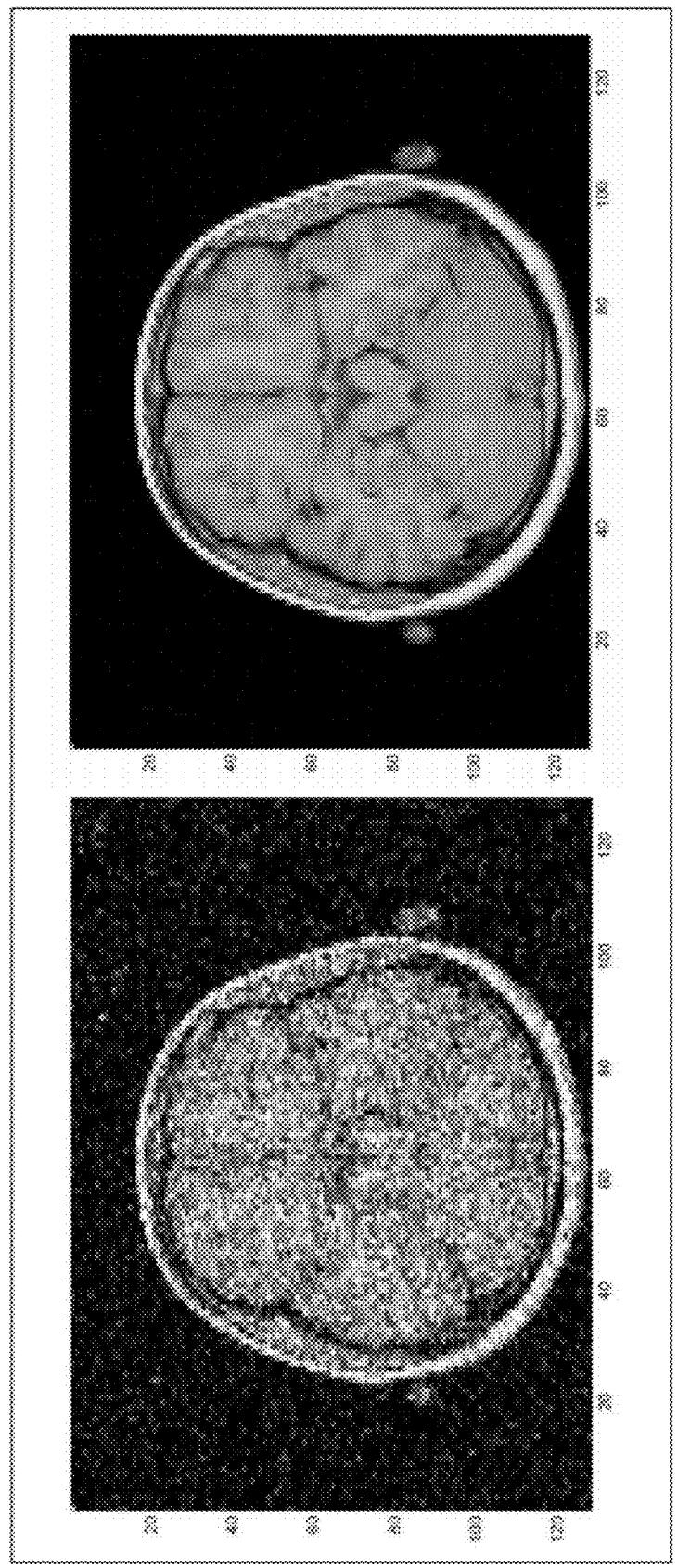
FIG. 5 shows simulations for non-CRISP (left) and CRISP (right) data processing examples in accordance with an embodiment of the invention.

The results from this simulation comparing a conventional MRI system and an N=128 channel CRISP MRI system are demonstrated in FIG. 5. In both cases, the magnetic field strength, scan time, and object signal are the same—the only difference being whether CRISP has been implemented or not.

From visual inspection, it is clear that the image SNR in FIG. 5 (right side) has been significantly improved. Analysis of this data indicates that, for this implementation of CRISP, the SNR increase is equal to the predicted value of a factor of the square root of 128=11.3.

CRISP in the Readout Direction: Special Case—SUPER-CRISP MRI

It is worth considering aspects of the special condition when the number N channels of a CRISP MRI system is equivalent to the number of pixels in the frequency encoding direction of a rectilinear k-space acquisition. This condition can be referenced as SUPER-CRISP MRI. In combination with maximized parallel imaging using CRISP technique, whereby the number of phase encoding parallel imaging channels is equivalent to the number of pixels in the phase encoding direction, this further condition can be referenced as ULTRA-CRISP MRI.

With a SUPER-CRISP MRI system for a data matrix 256×256, if 256 antennae are used for phase encoding parallel imaging under CRISP conditions (ULTRA-CRISP), a 256-channel CRISP MRI system is used with filter-bank implementation, and readout gradient, regionally selective excitation and reception may be performed. That is, signal from any one location can be selected by choosing the appropriate phase encoding antennae and the appropriate CRISP data channel for that phase encoding antenna. Selection of a particular CRISP data channel is equivalent to selection of a corresponding strip of tissue perpendicular to the frequency encoding direction, just as selection of a particular phase encoding antenna represents a strip of tissue perpendicular to the phase encoding direction. In this case, only a few data samples are required per CRISP data channel. If enough parallelism were present, all 256×256 data points can be collected at once.

If the same amount of acquisition time is assumed, when this ULTRA-CRISP MRI system is compared to a non-CRISP MRI system with 256 phase encoding antennae, 256 averages may be collected using the former, equivalent to a factor of 256 improvement in SNR, not including gains due to multi-channel CRISP parallelism already discussed in previous sections.

With a SUPER-CRISP MRI system for a data matrix 256×256, if 16 phase encoding parallel coils are used instead, and a 256-channel SUPER-CRISP MRI system is used, the same spatial localization in the frequency encoding direction applies such data only a few data samples per CRISP data channel need be obtained, albeit 16 different times to accommodate phase encoding.

Further Discussion on CRISP in the Readout Direction

There are many ways to invert the k-space data from the CRISP MRI/MRS system to generate an image of the target tissue volume. In other words, creation of an image from the detected k-space data can be done via several paths. One way to do this is to consider the k-space data for only a subset of all detectors at frequency $f_o$. In the simplest case, a direct IFT of the k-space data for $f_i$ results in an image of a strip of material corresponding to the volume of constant frequency. Since the IFT is a linear operator, images resulting from inversion of the k-space data for frequencies other than $f_o$ can be added together to form a complete image of the 2D or 3D tissue slice activated by a RF excitation pulse in MRI. In other words, a slice of the image is generated by processing the k-space data from a single spectral channel. By adding together a collection of strips, an image can be generated.

Creation of the image profile along a strip from the k-space data is not always a straightforward process. This is especially true for multi-channel CRISP MRI/MRS applications where more than one spectral component is present in each channel. These situations demand more complicated analysis schemes. Advanced algorithms such as CLEAN, maximum entropy and related techniques have been extensively used to reconstruct Fourier images, and are easily applicable to this case. For cases where the sampling in k-space is not dense (i.e. radial acquisitions), it is important to remove (i.e. deconvolve) the non-ideal point-spread-function from the underlying signal intensity distribution of the image. This feature can also be incorporated into the inversion algorithm used to infer images from k-space data sets. Alternatively, Bayesian estimation methods can be used to directly infer the underlying true signal intensity distribution.

For these situations, the goal is to solve for the image signal intensity distribution which, when Fourier transformed, results in model k-space amplitudes and phases that are a "best-fit" (in a least-squares sense) with the observed k-space data. These algorithms are generally much more computationally intensive than direct or fast Fourier methods, but also permit a more accurate reconstruction of the final image (mainly due to their ability to properly incorporate a priori information and constraints into the final solution).

Conventional NQR

NQR is a resonant electromagnetic property of certain nuclei that can be used to create scanning technologies. NQR involves the nuclear electric moment and has been used as the basis for NQR spectroscopy, primarily using $^{14}N$ and $^{35}Cl$, for the detection of nitrogen-containing explosive materials (except some liquid explosives such as those associated with PFM-1) and hydrochloride-containing contraband materials (heroin, cocaine) respectively.

NQR involves the resonant excitation and emission of electromagnetic waves from certain nuclei that have a net electric dipole moment. Specifically, these nuclei are disturbed from thermodynamic equilibrium using electromagnetic waves at their respective quadrupole resonant frequencies. As in NMR, these waves are typically in the RF range. As the nuclei relax back to thermodynamic equilibrium, there is emission of RF waves at the same resonant frequencies. Unlike NMR-based scanning technologies, NQR-based scanning technologies can be performed without the use of an external magnet. Because of the presence of relatively large internal fixed electric field gradients within solid substances containing NQR nuclei, there is significant resonant frequency sensitivity to local chemical structure, and many NQR nuclei-containing substances have unique NQR chemical shift signatures. As a result, there have been increasing developments in the non-invasive detection of substances by NQR, especially for explosives and for contraband.

In NQR, a narrowband high-Q RF coil is used for signal collection, and the subsequent electrical signal is mixed, sampled, minimally processed, and then stored. An IFT is then performed on the sampled data to provide a final image or signal profile. This is invariably performed using an FFT algorithm. In spectroscopic mode, peak detection from the final digital signal profile is performed. In imaging mode, a digital NQR image of the object is obtained.

Overall, NQR-based scanning technology development has been relatively slow compared to NMR-based scanning technologies, because NQR-based scanning technologies face numerous basic challenges.

First, an important impediment to NQR-based scanning technologies is an inherently low NQR signal relative to total material mass (net SNR typically less than 1 for a non-averaged experiment). The overall scan times are lengthened as a result, acting to limit the scope and practicality of NQR-based explosives detection. For example, an acceptable NQR coil distance from the target material becomes constrained by an inherently low SNR. For one-sided detection systems, e.g. explosive mine detection, NQR coils must also be placed relatively close to the target material (less than 10 cm), which means that if the target material is buried in the ground, there is a very small standoff between the coils and the ground. Also, the overall SNR is further reduced by at least a factor of 2 if the NQR coils are moving rather than stationary.

Second, since NMR spectra are typically located within a 10 ppm range (i.e. approximately 600 Hz at an applied magnetic field of 1.5 T) high-Q NMR coil collection systems can be tuned to the appropriate frequency range to collect all desired spectra. NQR spectra are, in comparison, typically widely dispersed at low electromagnetic frequencies from 0.5 to 6.0 MHz. High-Q NQR coils are typically tuned to individual spectral lines for each target compound, for instance 3.41 MHz for RDX (a common explosive) and 842 kHz or 741 kHz for TNT, despite the presence of other spectral lines for each of these compounds, due to low SNR at each spectral line. There has been recent description of the simultaneous use of two or more high-Q NQR coils to collect more than one spectral line at a time for increased sensitivity and specificity. This use of multiple coils would increase the overall SNR of NQR signal detection.

Third, the frequencies of the spectral lines are highly dependent upon temperature and can change up to 20 kHz over normal seasonal and diurnal temperature variations. To compensate, present NQR-based scanning technologies field-adjust the resonant frequencies of coil-detection systems appropriately using auto-tuning mechanisms.

Fourth, the spectral lines tend to overlap with typically used communications frequencies including the AM radio range; this is particularly true for TNT. In fact, when present, the undesired RF signals can overwhelm the weaker TNT signal at commercial frequencies. One way to compensate for this is to use a separate RF coil for background RF detection and then to perform subsequent digital subtraction.

Finally, TNT is especially difficult to detect due to the relatively smaller amounts of TNT that are needed compared to other explosive materials and because it also has a longer $T_1$ relaxation than other explosive materials. The ability to detect TNT is important for general purpose explosives detection. Unfortunately, implementing TNT detection significantly delays overall scan time for detection by present NQR-based scanning technologies. The relative SNR of TNT is an order of magnitude worse than that of RDX.

CRISP NQR System

In this section, a description of the basics of a system for multi-channel CRISP for NQR-based scanning technologies is provided. This multi-channel CRISP system has an analog front-end that includes a combination of tuned RF hardware and frequency filter-bank(s) in order to create separate narrowband data channels. Data within each channel is sampled separately. In the digital back-end, data is then reconstructed separately, and then may be recombined into an image or image/signal profile. The purpose of CRISP NQR is to increase SNR through reduction of cross-frequency noise and by spectral separation method.

Step 1: Division of Input Signal into Multiple Data Channels:

Several practical embodiments of a multi-channel CRISP NQR system are described in this section. In the first embodiment, multiple RF coils are each tuned to a distinct frequency range encompassing one or more target spectral lines. Each RF coil output is attached to a multi-channel CRISP filter-bank. This is similar to a combination of the embodiments of FIG. 2B and FIG. 2C, and is described in FIG. 7.

Figure 7:
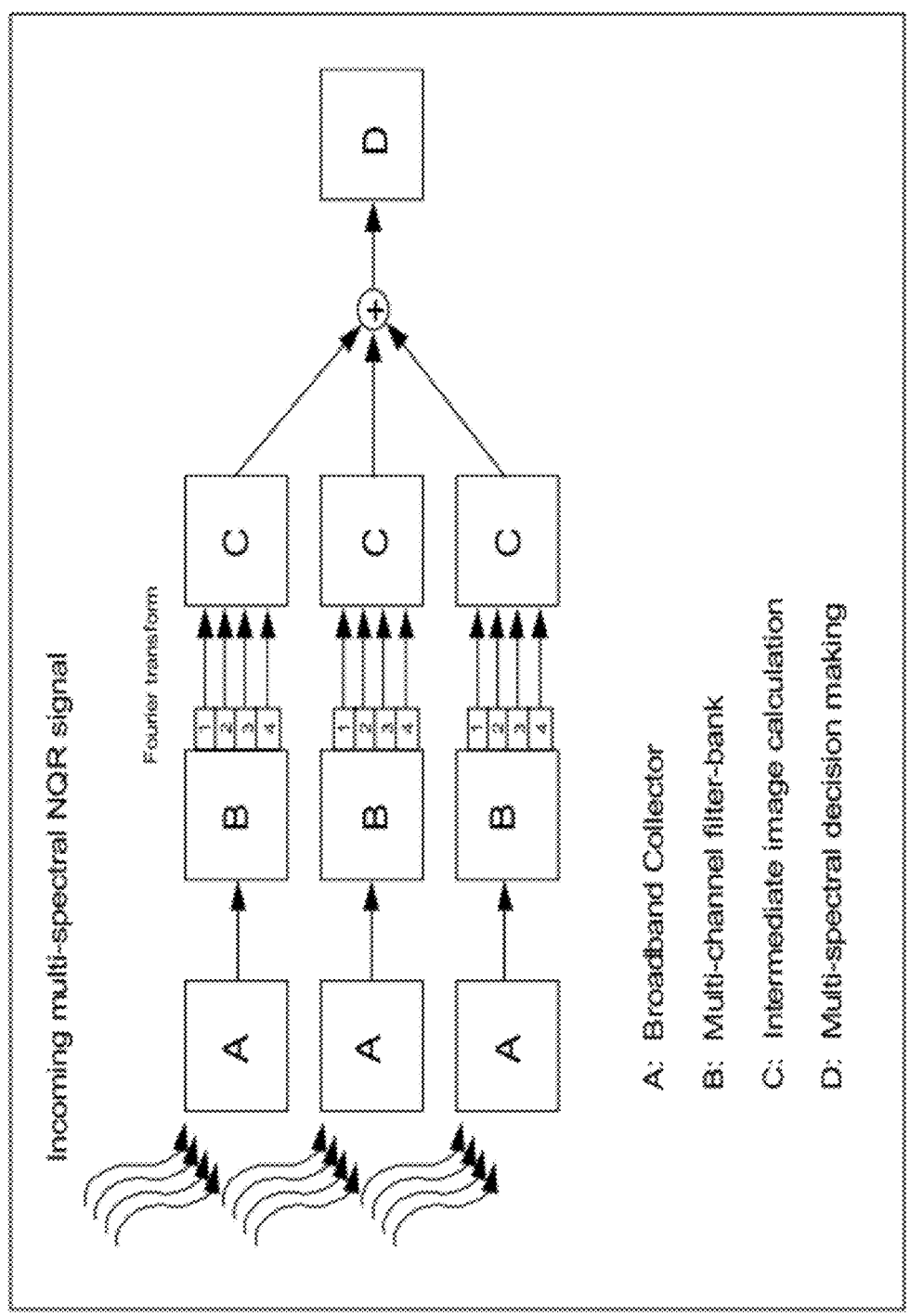
FIG. 7 shows a NQR scanning system in accordance with an embodiment of the invention.

As shown in FIG. 7, multiple broadband RF coils receive a NQR signal. Each broadband RF coil encompasses a number of target NQR spectral lines. These lines are resolved using CRISP technology (frequency filter-bank version). In turn, calculation of intermediate images and subsequent summation creates the final image or signal profile. In one embodiment, resolved spectral peaks are then characterized according to the known distributions of the spectral lines for target substances.

In the second embodiment, a single broadband RF coil is tuned to a wide frequency range including many target spectral lines, and it is attached to a multi-channel CRISP filter-bank. This is similar to the CRISP embodiment described in FIG. 2B. In this case, narrowband excitation of the target in a sweeping fashion, either continuous or pulsed, is integrated with the use of a multi-channel CRISP frequency filter-bank system. In either embodiment, low noise RF coils, e.g. superconducting RF coils, low temperature RF coils may be used. Because of the breadth of the target spectral lines, it may be more optimal not to use contiguous spectral coverage with the narrowband CRISP data channels, but instead be more selective in the ranges that are covered by either the physical coils or by the frequency filter-bank.

Step 2: Channel Specific Data Sampling

Data sampling is performed separately for each CRISP data channel either with a dedicated or a multiplexed A/D converter. Because of reduced Nyquist-Shannon sampling rate constraints described earlier, the time to acquire a complete data set reduces by a factor of the number of channels N. Compared to the conventional case, this would reduce SNR, as less data samples would be taken per incoming frequency component, but more data may be collected by signal averaging to increase SNR to a desired level as a form of compensation.

Step 3: Channel Specific Data Reconstruction

In a multi-channel CRISP NQR-based system, data reconstruction is performed separately on the data in each CRISP data channel. This is a key step that constrains cross-frequency noise within each data channel. Nominally, a direct IFT may be performed.

Step 4: Data Recombination Into A Signal Profile

After separate transformation in each CRISP narrowband data channel, the data from each channel is recombined into a signal profile. Since position is encoded by frequency, data recombination involves concatenation of outputs from the narrowband CRISP data channels according to their corresponding positions. This action may be considered summation if non-relevant frequency positions are zeroed in each channel output.

Multi-Channel CRISP NQR: Gain in SNR

A multi-channel CRISP NQR system has higher SNR than a conventional NQR system, substantially improving signal peak detectability and decreasing scan times. For example, an N-channel CRISP NQR system where each RF coil is attached to a 2048-channel frequency filter-bank version would have up to 1N, i.e. 45, times more SNR than a conventional NQR system for cross-frequency noise dominated situations. This markedly improved SNR capability can be used to increase performance in a number of ways.

First, the primary effect of increased SNR is an improvement in overall sensitivity to each NQR spectral line. This has a direct important effect in detection of weak spectral lines. This increases the sensitivity to ever smaller amounts of target substance and for substances such as TNT which have an inherently weaker NQR signal. This primary increase in SNR is regardless of the Q of the RF coil that is used for detection. CRISP improves SNR by significantly reducing cross-frequency noise introduced by the signal detection and transformation process, and by spectral separation effects as outlined in an earlier section.

Second, this increased SNR permits the use of more broadband RF coils which will have lower inherent Q sensitivity, and therefore reduced SNR, than a narrowband high-Q RF coil. Broadband RF coils can be advantageous in exciting more than one spectral line simultaneously, even those that are relatively far apart in frequency and not related by coupling effects, e.g. doublets. Moreover, this allows deliberate simultaneous excitation of multiple target NQR nuclear species.

Third, it permits an increased distance of the RF coil from the target material. This permits safer, more practical scanning for buried and hidden explosives. This is especially relevant to one-sided detection systems which are less sensitive than multi-sided detection systems. It is also relevant to detection of target substances within large objects such as vehicles and containers.

Fourth, it will increase the performance capabilities of NQR detection systems when employed in situations when the RF coil is moving relative to the target substance. This has a direct effect on increasing the efficiency and the practicality of using moving vehicles for the detection of target substances in a region.

Fifth, it will significantly reduce the overall scan time. This will permit increased coverage and throughput of target substance detection schemes.

Sixth, it may reduce the overall complexity of NQR pulse sequence techniques that are used in the field. Presently, steady-state free precessional pulse sequences are used because of increased SNR, but the use of simpler pulse sequences may be afforded by CRISP NQR.

Seventh, conventional NQR systems tend to focus on the stronger NQR spectral line signatures for each target substance. With increased inherent SNR, it may be more useful to perform NQR excitation at selective spectral lines that are more distinct to the target substances, and not necessarily the strongest signal NQR spectral line for that target substance.

Multi-Channel NQR CRISP: Multi-Spectral Signal Detection

An additional improvement in detection sensitivity can be performed by the use of multi-spectral line detection as afforded by CRISP NQR. This is beyond the SNR improvement inherent to CRISP NQR.

In multi-spectral line detection, peak detection is performed for each frequency range that corresponds to each CRISP narrowband data channel. This is a simple task when performed by computer. Because of the significant variation of resonant frequencies including temperature-induced variation, additional information such as external measurements of temperature and/or the frequency range (which is known) can be used to determine the chemical origin of each detected peak in the signal profile.

The CRISP NQR system of spectral peak detection has a number of advantages.

First, there is an advantage to using more than one spectral line for detection, as each target substance has an arguably unique set of NQR spectral lines. Sensitivity for the detection of target substances would increase in SNR-limited applications when more than one spectral line for each target substance is being sensed. This may compensate for a reduced Q for RF coil systems when using a broad rather than narrow frequency sensitivity range or for a reduced SNR when the detector is moving relative to the target.

Second, the ability to detect multiple different NQR spectral lines also means that multiple different target substances can be sensed simultaneously and not serially. This has a marked effect on overall scan times, e.g. detection of various explosive materials in anti-personnel mines.

Third, the need to auto-tune a NQR system to compensate for such variables as temperature would be markedly reduced. For example, a target spectral line may change its resonant frequency by 20 kHz diurnally because of varying temperature. This may either put the resonant frequency out of range of a high-Q RF coil or may push it into a region of low sensitivity for the high-Q RF coil relative to its resonant sensitivity. If a multi-channel CRISP filter-bank system is attached to a broadband RF coil, the temperature shifted signal from the target spectral line will be processed by different channels within the CRISP NQR system, but nonetheless would be detected without the need to change or tune the RF coil resonant frequency. The identity of a spectral line can be determined using nominal target spectral line distributions and knowledge of the temperature.

Fourth, multi-spectral line detection is not limited to a single RF coil in a CRISP NQR system. The results of various narrowband and broadband RF coils attached to CRISP NQR and used in serial, simultaneous, or interleaved fashion can be incorporated into an over-riding scheme of multi-spectral line detection.

Methods of NQR Scanning Based on Multi-Channel CRISP

Multi-Channel CRISP NQR: Signal Subtraction

A useful part of an NQR detection system for explosives is a subtraction mechanism for removing interference from commercial RF sources. This involves the use of a separate coil far removed from the target area, which has similar RF coil characteristics to the RF coil used in the target area. The signal subtraction has been described as a digital technique. In CRISP NQR, a subtraction mechanism is also proposed, which can be either digital subtraction or using analog subtraction circuits. Analog subtraction is an attractive method as it is direct and performed without digitization errors.

Multi-Channel CRISP NQR: Interleaved Excitation

It may not be desirable or practical to use a single broadband RF coil to cover the entire potential NQR spectrum of target substances. Instead, it may be more desirable to use any combination of narrowband RF coils and/or broadband RF coils to target certain clusters of spectral lines. Each of these coils would be attached to a CRISP NQR frequency filter-bank for improved SNR above conventional NQR techniques via reduction of cross-frequency noise and spectral separation.

Numerous modes of excitation and reception of signal can be performed with this configuration, all methods to perform multi-spectral line excitation, detection, and analysis.

Nominally, the entire combination of RF coils may excite at the same time, and receive at the same time. Information from the peak detection performed for each coil output can be analyzed together via computer algorithm to determine whether or not target substances are present.

Figure 8:
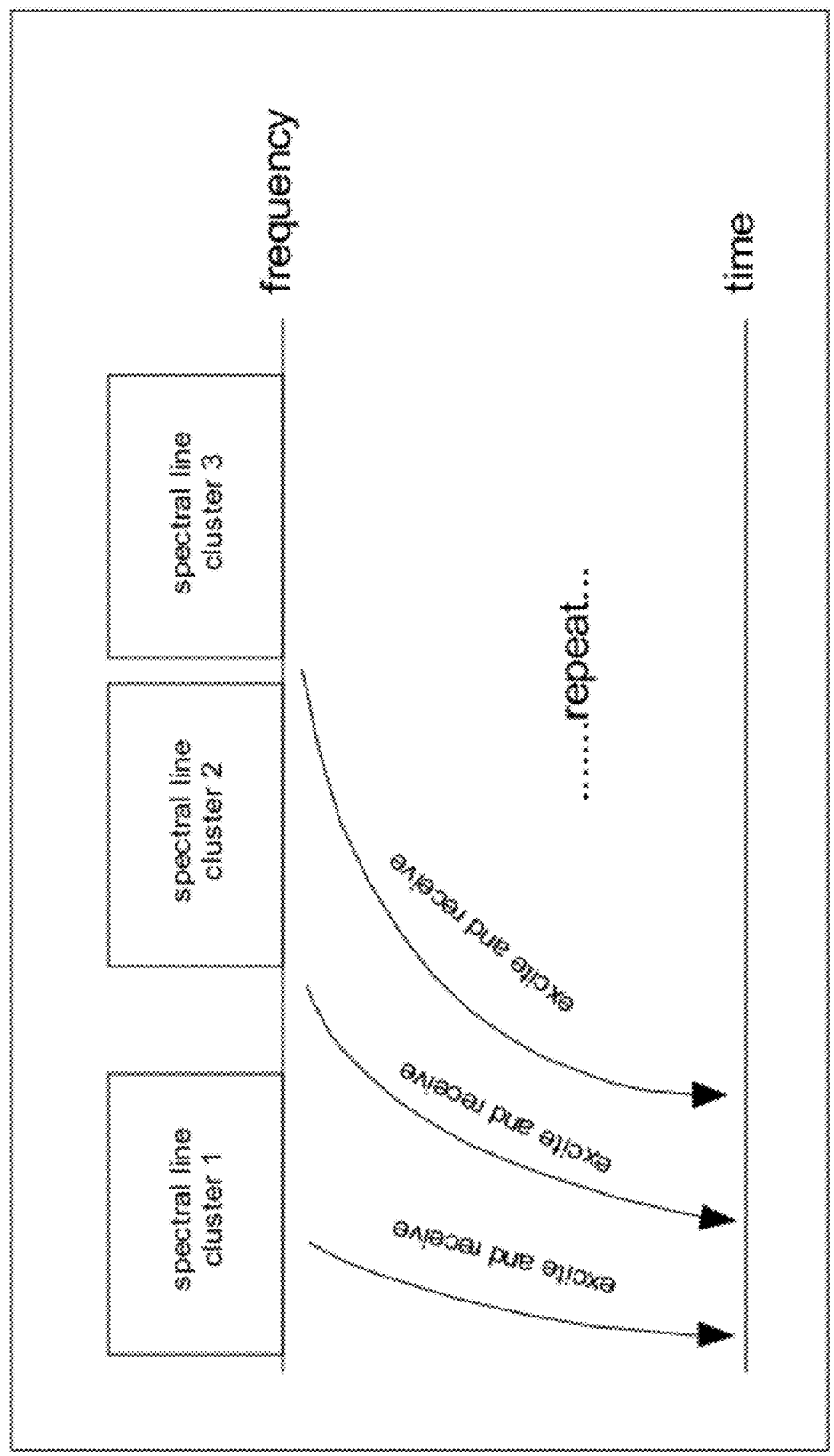
FIG. 8 shows a schematic diagram that depicts the interleaved excitation of NQR spectral line clusters in accordance with an embodiment of the invention.

Alternatively, interleaving of excitation may be performed. This involves using the wait time between excitation and signal reception to perform other excitation and/or signal reception. For example, target substances may have clusters of spectral lines in three different frequency ranges. These frequency ranges may be widely separated in frequency. Each frequency range would be targeted with a dedicated RF coil attached to a CRISP NQR frequency filter-bank. Each frequency range may be separately excited and received in series, permitting relaxation recovery in each frequency range prior to the next excitation while utilizing this time to perform additional excitations (FIG. 8). Specifically, as shown in FIG. 8, after excitation of all clusters, the excitation and reception is then repeated. These lines do not necessarily have to be coupled spectral lines to a particular NQR nuclear species. Additionally, depending on the T1 of the target spectral lines, each cluster does not have to be excited at each repetition interval.

Alternatively, decoupling of excitation for different target substances may be performed as a modification to this technique. For example, a target substance may have a longer $T_1$ value relative to other target substances. Excitation of spectral line frequencies that are specific to that target substance can be performed at a repetition time longer than excitation at other spectral line frequencies for different target substances in order to optimize signal relaxation. Because of the increased SNR inherent in CRISP NQR, characteristic spectral lines other than those previously used in conventional NQR systems can be used in this manner.

Multi-Channel CRISP NQR: 1D CRISP NQR Scanning

Standard NQR scanning techniques presently are performed in spectroscopic mode, and outputs are essentially signal profiles. After separate transformation in each CRISP narrowband data channel, the data from each channel is recombined into a signal profile. Since position is encoded by frequency, data recombination involves concatenation of outputs from the narrowband CRISP data channels according to their corresponding positions. This action may be considered summation if non-relevant frequency positions are zeroed in each channel output.

Multi-Channel CRISP NQR: Multi-Dimensional CRISP NQR Scanning

Although NQR-based scanning technologies are mostly spectroscopic, there has been a recent description of the use of superimposed applied magnetic gradients with NQR for spatial localization. CRISP NQR image creation can be performed in a fashion similar to CRISP MRI as described in the CRISP MRI section.

Multi-Channel CRISP NQR: Multi-Spectral Decision Algorithm

The outputs of each CRISP channel are analyzed by computer to determine the presence of spectral line peaks. This determination nominally can be performed by locating signal peaks relative to the noise background. This determination is also aided by the expected location of certain peaks relative to other peaks.

Once spectral line peaks in each CRISP channel are determined, the spectral line peak information from each CRISP channel from each RF coil is combined to determine the presence of target substances.

Other Applications

It should be understood that the above-described embodiments and the following examples are given by way of illustration, not limitation. Various changes and modifications within the scope of the present invention will become apparent to those skilled in the art from the present description.

Section Three Applications of Multi-Channel CRISP Systems

General Applications:

Multi-channel CRISP systems can be applied to many different types of signals. These signals include (1) mechanical waves and (2) electromagnetic waves. Any application that presently takes a broadband signal, performs a Fourier or Inverse Fourier Transform, and then displays or stores the resulting image data or signal profile data would benefit from the use of an adapted multi-channel CRISP system. A multi-channel CRISP system can be used in applications where there is a relative paucity of SNR preventing or limiting analysis and visualization of an electromagnetic or mechanical signal, or simply to improve the SNR of more mainstream applications. A multi-channel CRISP system for these general applications requires either a broadband signal is received first and then sent to a frequency filter-bank to create the CRISP narrowband data channels or multiple tuned collectors are used to directly funnel the narrowband signal into CRISP narrowband data channels. Sampling, reconstruction and recombination of data are then performed.

(1) Mechanical Waves

Mechanical waves are used routinely for detection and/or imaging of various liquid and solid structures. Fourier Transforms are routinely used on data from mechanical waves in the form of Doppler wave interrogation, such as in medical Doppler ultrasound.

(2) Electromagnetic Waves

Electromagnetic waves are routinely used for communications, detection and/or imaging.

Other than in MRI/MRS, a multi-channel CRISP system can be used in many different types of RF applications. A multi-channel CRISP system would be useful especially for RF where RF signal is weak, such as in GPS applications, or satellite-related applications. Communication through the earth using electromagnetic waves such as RF waves can be performed with significantly higher SNR using a CRISP implementation. Radio-reception would be improved substantially by use of a CRISP implementation. Direct narrowband reception prior to detection would be the preferred form of implementation.

Microwave radiation is used for many applications including communications and imaging. Multi-channel CRISP systems for superior detection can be implemented using frequency filter-banks or direct narrowband reception prior to detection.

Recently, terahertz range electromagnetic radiation has been more actively used for imaging and spectroscopy. Terahertz radiation has the advantage of relatively short wavelengths for good spatial resolution, the advantage that it is non-ionizing, and that spectroscopic analysis of materials can be performed. Terahertz radiation can penetrate clothing, paper, and plastic, making it an excellent for imaging and detection in industrial settings, such as through packaging, as well as for security screening. The spectroscopic features of terahertz permit spectral characterization of materials, body tissue, among others. Spectral remote sensing can also be performed using terahertz radiation. The same principles for developing implementations as described in this document apply to terahertz range multi-channel CRISP systems. A multi-channel CRISP system would use either a frequency filter-bank or direct narrowband reception prior to detection.

Application to Sensing Technologies for Landmine and Explosives Detection

Other than NQR, many different sensing technologies exist for the detection of landmines and explosives, of which the majority is structured in that they can be modified into a multi-channel CRISP system.

For example, ground penetrating radar (GPR) is a form of imaging that uses RF waves in the earth. Depth of penetration is better with lower frequencies, but better spatial resolution is obtained with higher frequencies. There is high variability of performance depending on ground conditions such as the degree of moisture. The use of a multi-channel CRISP implementation would dramatically increase SNR. Furthermore, higher frequency RF waves may be used as a result of the increased SNR, thus providing better spatial resolution.

Infrared/hyper-spectral systems use temperature, reflectivity, or other spectral variables to discern the presence of landmines from a distance. A broadband multi-spectral signal is received by these systems, and therefore can be modified with the use of a multi-channel CRISP implementation for improved SNR and characterization.

Acoustic, ultrasound, and seismic systems use mechanical vibrational waves to image the earth surface, providing detection of landmines among other objects. The nature of the waves is multi-spectral, and therefore, amenable to a multi-channel CRISP implementation.

Vapor detection techniques use wave-based spectroscopic analysis of air-borne particles and can also benefit from a multi-channel CRISP implementation. That is, vapor detection systems that process input signals as Fourier transformed data can use the frequency filter bank approach recited herein to improve SNR. This may be performed completely in the wave arena if possible. Alternatively, it may be performed by transduction of the incoming waves into an electrical signal prior to being sent to a frequency filter bank.

All of these applications may be combined with a CRISP implementation. Furthermore, these technologies may be combined to provide improved sensitivity for target substances. This includes the use of CRISP NQR as outlined in this document.

Additionally, CRISP NQR may be combined with CRISP NMR to determine the presence of target materials which have either or both an NQR and NMR signal.

MRI/MRS Applications

Certainly, all applications of conventional MRI/MRS/MRSI would benefit from the markedly increased SNR that a multi-channel CRISP system would provide. This would translate to overall higher sensitivity for MRS and MRI, higher spatial resolution for MRI, and faster imaging for MRI.

In addition, certain fringe MRI arenas that require more signal would become more feasible using the CRISP method. Such arenas include low field MRI, very low field MRI, and portable MRI.

Low field MRI includes MRI in magnetic fields below 0.5 T, and typically involves magnetic fields at 0.2 to 0.3 T. There are a number of advantages to low field MRI compared to standard 1.5 T MRI. These advantages include proportionately reduced chemical shift artifacts, reduced static magnetic field inhomogeneity effects such as geometric distortion, relaxed RF tissue heat deposition constraints, faster $T_1$ relaxation recovery times, and magnet cost. Typically, low field MRI would have an associated disadvantage of proportionately reduced SNR compared to 1.5 T MRI, but a CRISP MRI implementation would change this. For example, a 64-channel CRISP MRI system at 0.2 T would have up to 8 times more SNR than a conventional 0.2 T MRI system (i.e. similar to a 1.6 T conventional MRI system) with the advantages of low field MRI as outlined. A 256-channel CRISP MRI system at 0.2 T would have up to 16 times more SNR, similar to a 3.2 T conventional MRI system, again with the advantages of low field MRI as outlined.

MRI at very low fields such as the earth's magnetic field (0.5 Gauss=$5\times10^{-5}$ T) has the advantages of imaging without the use of a magnet or with a very inexpensive magnet. This arena of MRI can be significantly improved by using a multi-channel CRISP MRI system. Here, an N-channel CRISP MRI system where N is very large such as 2048 can be considered; such a system would have up to the square root of 2048 or approximately 44 times the SNR of a conventional MRI system.

Portable MRI systems may be possible due to higher SNR obtained by using a multi-channel CRISP MRI system. Portability usually implies a relatively small magnet footprint. The magnetic field may be created by a permanent magnet or may be resistive in nature. There would be a relatively small volume of desired magnetic field homogeneity for a small magnet. Such systems are not presently feasible using conventional MRI but again, multi-channel CRISP MRI would make this magnet arena more feasible. Canister MRI systems that would be dedicated for head imaging or extremity imaging would become much more feasible using multi-channel CRISP MRI.

It is important to note that fringe MRI magnet designs now become more feasible using multi-channel CRISP MRI. Many potentially viable magnet designs or concepts are likely not considered because superconducting magnet versions are too difficult or impossible to make, and low magnetic field versions have associated SNR that is too low using conventional MRI.

Flat-bed magnet designs would generally have a low magnetic field associated with them. These magnet designs have the advantage of a completely open architecture. In addition, there would be no patient imaging bed weight limitations. Presently, approximately 10% of the general patient population experiences significant claustrophobia during 1.5 T magnet closed bore MRI, such that sedation is often required; such patients would benefit from a completely open architecture. Other patients that would benefit from a completely open architecture would include massively obese patients, intensive care unit patients who are often intubated and have many clinically important attached lines and tubes, and pediatric patients.

Novel magnet designs may be implemented. For example, shaped designs for imagine different parts of the body may be used in conjunction with multi-channel CRISP MRI. These designs may be fixed or non-fixed. For example, it may be desirable to image a part of the body whereby the magnet is shaped relative to that part of the body. This magnet design may be made up small components that can be shifted or changed in position depending upon the particular anatomy of the patient or target tissue volume.

It may be desirable in certain circumstances to use a multi-polar magnet set-up for imaging. For example, it may be desirable to have a magnetic field running through the pelvis in a cranial-caudal direction for certain imaging, but to have the magnetic field running through the pelvis in an anterior-posterior direction for other imaging, to permit certain RF coils to work better, e.g. solenoidal RF coils. A multi-polar magnet for such a purpose can be used in conjunction with a multi-channel CRISP MRI system.

The relatively fringe arena of veterinary MRI could also be addressed. Large animal imaging such as horses and zoo animals would also be more feasible using flat-bed magnet designs. Large animal MRI of legs such as in racehorses would be more feasible with the use of a portable MRI canister design using CRISP methodology as outlined in this document.

Low field magnets may be rapidly rotated in order to counteract the effects of static field inhomogeneities. If, in addition to rapid rotation, multi-channel CRISP MRI was performed, the feasibility of such magnets would be greatly increased.

It may be of benefit to perform MRI with an oscillating main magnetic field. This may counteract effects of static field inhomogeneities. This would be most feasible at low fields using resistive magnets. Performing multi-channel CRISP MRI in this kind of arrangement would make it more feasible due to increased SNR.

Many MRI/MRS applications within the body would benefit from markedly increased SNR using multi-channel CRISP MRI/MRS implementation. Higher spatial resolution, better conspicuity of disease, better definition of anatomy, faster imaging would be made more feasible.

Imaging of solids within the body would become more feasible from the higher signal at very short TE values afforded by multi-channel CRISP MRI. Such applications would include imaging of calcium within bone or arterial vessels, direct imaging of collagen fibers within muscles, tendons, bone, and cartilage, direct imaging of neurological fiber tracts, lung parenchymal imaging, and imaging of lymphatics.

Imaging of water within the body in areas where there is a relatively paucity of water or where there are high T2* species would also become more feasible. Applications would include bone imaging and lung imaging. Such applications are of great value such as for osteoporosis assessment and lung cancer screening.

Rapid imaging of areas of the body that are sensitive to RF heat deposition such as testicles and eyes would also be made technically feasible under regulatory guidelines using multi-channel CRISP MRI.

The development of abdominal MRI has been limited by significant motion artifacts. Rapid imaging of the abdomen, including real-time imaging, would become much more feasible using multi-channel CRISP MRI. Real-time imaging of swallowing and peristalsis would also be feasible.

The development of pediatric MRI has been limited by both significant motion artifacts and poor SNR due to small structures. It also would benefit from faster imaging and higher spatial resolution afforded by multi-channel CRISP MRI.

Functional MRI (FMRI) is a rapidly growing field that uses differences in susceptibility of oxygenated and deoxygenated blood to determine areas of increased blood flow within the brain during various forms of stimulation. Typically, the signal differences between oxygenated and deoxygenated states in activated areas of the brain are on the order of 2-4%. This would also be an application that would benefit from higher SNR as provided by the CRISP technique.

Ischemic tissue can be better assessed using susceptibility techniques such as BOLD. In the emergent situation, areas of extreme ischemia in stroke or myocardial infarction can be rapidly identified using such techniques. In the ambulatory setting, subtle tissue ischemia would be better picked up due to markedly increased sensitivity from multi-channel CRISP MRI or MRS. Thus, early diagnosis of ischemia problems could be made. This would include micro-vascular ischemia, which is presently much harder to diagnose than macro-vascular ischemia.

With higher SNR from multi-channel CRISP technology, tumors become more detectable and more easily characterized using rapid imaging to assess arterial and venous flow signature, MRS and MRS imaging (MRSI) techniques to determine character and response to treatment such as citrate imaging in prostate cancer.

Non-invasive evaluation of blood glucose levels is useful for the millions of diabetics that must micro-puncture their fingers routinely for a blood sample. Blood glucose imaging such as using a small finger canister for MRS evaluation could be possible using multi-channel CRISP technology.

Because of markedly increased sensitivity, molecular imaging using multi-channel CRISP technology becomes more feasible. Native species such as C-13 could be imaged within the body. Similarly, small amounts of administered materials of atomic species with net magnetic moments could be picked up using multi-channel CRISP technology.

Subtle contrast agents could also be more meaningful in the setting of multi-channel CRISP technology. For example, injection of sterile saline boluses within the body could potentially be tracked by changes in susceptibility. Gaseous administration of carbon dioxide or oxygen, among other gases, could be performed, again to enhance susceptibility effects. Direct imaging of such gases within the body could also be made. Similarly, administration of tiny amounts of relatively toxic contrast agents that would not be detectable using conventional MRI technology would also become feasible.

Additionally, a multi-channel CRISP MRI system would improve methods for targeted regional imaging of the body because the use of narrowband detection in the readout direction is related to localized spatial position. Regional detection in this manner can be performed by CRISP MRI singularly, in combination with parallel phase encoding techniques or singularly, and/or the use of spectral-spatial excitation.

Extremely high resolution imaging of the body would now be feasible. Imaging of skin, such as to evaluate depth of invasion of melanomas, using portable MRI technology would be feasible.

Solid state MRI would benefit tremendously from multi-channel MRI/MRS techniques. For example, solids have a very wide $^1H$ frequency spectrum due to relatively immobile protons. Rapid decay of signal due to very strong $T2^*$ effects is characteristic of $H^1$ imaging of solids. By markedly increasing SNR, better evaluation and imaging of solids may be obtained.

Porous state imaging and analysis is also another area that would benefit from multi-channel CRISP MRI/MRS/MRSI. It is often desired to image the porous material surrounding a drill hole such as in oil drilling. By providing significantly larger SNR than conventional MRI, multi-channel CRISP MRI would increase sensitivity in particular in this application. Better characterization of porous rock and fluid within the porous spaces can then be obtained using multi-channel CRISP MRI.

Imaging of atoms and molecules at the nanoscale level would also be significantly affected by the large SNR gains that multi-channel CRISP MRI provides.

It should be understood that the above-described embodiments and the following examples are given by way of illustration, not limitation. Various changes and modifications within the scope of the present invention will become apparent to those skilled in the art from the present description.

Computers and computer systems described herein may include operatively associated computer-readable media such as memory for storing software applications used in obtaining, processing, storing and/or communicating data. It can be appreciated that such memory can be internal, external, remote or local with respect to its operatively associated computer or computer system.

Memory may also include any means for storing software or other instructions including, for example and without limitation, a hard disk, an optical disk, floppy disk, DVD (digital versatile disc), CD (compact disc), memory stick, ROM (read only memory), RAM (random access memory), DRAM (dynamic random access memory), PROM (programmable ROM), EEPROM (extended erasable PROM), and/or other like computer-readable media.

In general, computer-readable memory media applied in association with embodiments of the invention described herein may include any memory medium capable of storing instructions executed by a programmable apparatus. Where applicable, method steps described herein may be embodied or executed as instructions stored on a computer-readable memory medium or memory media. These instructions may be software embodied in various programming languages such as C++, C, Java, and/or a variety of other kinds of software programming languages that may be applied to create instructions in accordance with embodiments of the invention.

The methods and systems described herein can be performed in software on general purpose computers, servers, or other processors, with appropriate magnetic, optical or other storage that is part of the computer or server or connected thereto, such as with a bus. The processes can also be carried out in whole or in part in a combination of hardware and software, such as with application specific integrated circuits. The software can be stored in one or more computers, servers, or other appropriate devices, and can also be kept on a removable storage media, such as a magnetic or optical disks. Furthermore, the methods and algorithms described herein can be implemented using as an SDK, an API, as middleware, and combinations thereof.

It is to be understood that the figures and descriptions of the invention have been simplified to illustrate elements that are relevant for a clear understanding of the invention, while eliminating, for purposes of clarity, other elements. Those of ordinary skill in the art will recognize, however, that these and other elements may be desirable. However, because such elements are well known in the art, and because they do not facilitate a better understanding of the invention, a discussion of such elements is not provided herein. It should be appreciated that the figures are presented for illustrative purposes and not as construction drawings. Omitted details and modifications or alternative embodiments are within the purview of persons of ordinary skill in the art.

It can be appreciated that, in certain aspects of the invention, a single component may be replaced by multiple components, and multiple components may be replaced by a single component, to provide an element or structure or to perform a given function or functions. Except where such substitution would not be operative to practice certain embodiments of the invention, such substitution is considered within the scope of the invention.

The examples presented herein are intended to illustrate potential and specific implementations of the invention. It can be appreciated that the examples are intended primarily for purposes of illustration of the invention for those skilled in the art. There may be variations to these diagrams or the operations described herein without departing from the spirit of the invention. For instance, in certain cases, method steps or operations may be performed or executed in differing order, or operations may be added, deleted or modified.

Furthermore, whereas particular embodiments of the invention have been described herein for the purpose of illustrating the invention and not for the purpose of limiting the same, it will be appreciated by those of ordinary skill in the art that numerous variations of the details, materials and arrangement of elements, steps, structures, and/or parts may be made within the principle and scope of the invention without departing from the invention as described in the claims.

It should be appreciated that various aspects of the claimed invention are directed to subsets and substeps of the techniques disclosed herein. Further, the terms and expressions employed herein are used as terms of description and not of limitation, and there is no intention, in the use of such terms and expressions, of excluding any equivalents of the features shown and described or portions thereof, but it is recognized that various modifications are possible within the scope of the invention claimed. Accordingly, what is desired to be secured by Letters Patent is the invention as defined and differentiated in the following claims, including all equivalents.

What is claimed is:

1. A method of processing multi-frequency signals comprising:
    (a) obtaining a multi-frequency signal;
    (b) separating the multi-frequency signal into a plurality of frequency bands, each band of the plurality of frequency bands having a respective bandwidth;
    (c) removing a noise component from each of the plurality of frequency bands to generate a plurality of noise-reduced frequency bands; and
    (d) combining a predefined number of noise-reduced frequency bands to form a combined noise-reduced frequency signal.

2. The method of claim 1 wherein the multi-frequency signal is selected from the group consisting of radio frequency signals and acoustic signals.

3. The method of claim 1 wherein the step of separating the signal is preformed by utilizing one of:
    a plurality of filters in communication with a detector; and
    a plurality of frequency-tuned detectors.

4. The method of claim 1 wherein the step of removing a noise component from each of the plurality of frequency bands comprises the step of Fourier transforming each of the plurality of frequency components.

5. The method of claim 1 wherein the step of combining a predetermined number of noise-reduced frequency components comprises summing the plurality of Fourier-transformed noise-reduced frequency bands.

6. The method of claim 1 wherein the multi-frequency signal is selected from the group consisting of a magnetic resonance signal or a nuclear quadrupole resonance signal.

7. The method of claim 1 wherein the multi-frequency signal is an ultrasound signal.

8. The method of claim 1 further comprising the step of transforming the combined noise-reduced frequency signal to generate an image of sample, based on multi-frequency emissions from the sample.

9. The method of claim 8 wherein the impinging wave is selected from the group consisting of a mechanical wave, an electromagnetic wave, an ultrasonic wave, a radio frequency wave, and a terahertz wave.

10. A data acquisition apparatus, the apparatus comprising:
    a broadband receiver, the broadband receiver positioned to receive a composite signal comprising a plurality of emissions from a sample portion, the emissions generated in response to the sample;
    a frequency filter module in electrical communication with the broadband receiver, the filter module suitable for simultaneously filtering the plurality of emissions to generate N bands of narrow band frequency components;
    a data recorder, the recorder in electrical communication with the filter module such that the data recorder detects the N bands of narrow band frequency components after the narrow band frequency components have been received and filtered; and
    a processing module, the processing module adapted to remove a noise component from each of the N bands to generate a plurality of noise-reduced frequency bands; and to combine a predefined number of noise-reduced frequency bands to form a combined noise-reduced frequency signal.

11. The apparatus of claim 10 wherein the removal of the noise component from each of the N bands reduces noise in the noise-reduced frequency signal relative to the composite signal by a scale factor.

12. The apparatus of claim 11 wherein the scale factor is substantially equal to $N^X$, wherein X ranges from 0 to 1.

13. The apparatus of claim 10 further comprising a detector in electrical communication with the frequency filter module and the processing module, the detector capable of detecting the plurality of filter emissions.

14. The apparatus of claim 10 wherein the frequency filter module comprises a plurality of filters, each filter associated with an independent frequency band.

15. The apparatus of claim 10 wherein the emissions are generated in response to at least one wave impinging on the sample and wherein the at least one impinging wave is selected from the group consisting of a mechanical wave, an electromagnetic wave, an ultrasonic wave, a radio frequency wave, and a terahertz wave.

16. The apparatus of claim 10 wherein processing module further comprises a transform module that converts the combined noise-reduced frequency signal into an image of at least the sample portion.

17. The apparatus of claim 10 wherein the frequency filter module comprises a plurality of individual filters, each filter having individual filter characteristics, the filter module configured to modify the individual filter characteristics according to a spectral profile of the composite signal.

18. A method of reducing image noise generated using magnetic resonance data, the method comprising the steps of:
    (a) receiving a composite MRI signal from a sample of interest, the composite MRI signal comprising a plurality of emission frequencies from the sample of interest, wherein detection of the composite MRI signal using a single frequency channel would generate an aggregate noise component N1;
    (b) filtering the composite MRI signal into a plurality of M narrowband frequency channels; and
    (c) detecting the plurality of M narrow band frequency channels, after filtering the composite MRI signal, such that noise is recorded on a per channel basis such that the sum of the per channel noise components is substantially equally to N2,
    wherein the ratio of N2 to N1 is less than one.

19. The method of claim 18 wherein the filtering is performed using a frequency filter bank.

20. The method of claim 18 further comprising the step of: transforming the plurality of M narrowband frequency channels and combining a plurality of resultant transformed signals to form an image.

21. The method 18 wherein instead of a MRI signal a MRS signal, a MRSI signal, or a NQR signal are used.

22. An apparatus adapted to reduce noise in a wave-based data acquisition system, the apparatus comprising:
a common signal receiving bus adapted to receive a composite signal;
a plurality of isolated output buses; and
a frequency filter module comprising
a plurality of filter elements, wherein the filter elements each include an input and an output, each of the inputs in electrical communication with the common signal receiving bus, each of the outputs in electrical communication with one of the plurality of isolated output buses, the outputs electrically isolated from the other outputs and each of the inputs,
wherein the filter module filters the composite signal to generate N bands of narrow band frequency components and removes a noise component from each of the plurality of frequency bands to generate a plurality of noise-reduced frequency bands.

23. The apparatus of claim 22 wherein the filter elements are selected from the group consisting of analog band pass filters and/or digital band pass filters.

24. The apparatus of claim 22 wherein the composite signal is selected from the group consisting of a signal generated from a MRI scan of a sample; and a signal generated from an ultrasound scan of a sample.

25. A method of reducing cross frequency noise in a signal comprising:
receiving a broadband signal, the signal comprising a plurality of signal portions, each of the plurality of signal portions associated with a band of frequencies;
dividing the broadband signal into a plurality of narrowband components;
sampling from an analog signal to a digital signal each of the plurality of narrowband components;
reconstructing each of the plurality of narrowband components into a plurality of reconstructed components using a discrete transform; and
combining the plurality of reconstructed components into a signal profile, the signal profile having an increased signal-to-noise ratio relative to the received broadband signal.

26. The method of claim 25 further comprising the step of generating the broadband signal by impinging a sample of interest with a sound wave.

27. The method of claim 25 further comprising the step of generating the broadband signal by generating a magnetic field around a sample of interest.

28. The method of claim 25 further comprising the step of using a magnetic resonance signal from a sample, regardless of whether or not a magnetic field was applied to the sample.

29. The method of claim 25 wherein dividing the broadband signal further comprises filtering the broadband signal at a frequency filter bank into the plurality of narrowband components.

30. The method of claim 25 wherein dividing the broadband signal further comprises receiving the broadband signal into a plurality of narrowband receivers, each of the narrowband receivers tuned to a unique narrowband frequency range.

31. A noise reduction module for use and improvement of MRI, MRS, MRSI, or NQR comprising:
at least one antenna, the antenna receiving a broadband signal;
a plurality of filters, each of the plurality of filters receiving the broadband signal and passing a narrowband component of the broadband signal, each narrowband component spanning a frequency range;
a sampler in communication with the each of the narrowband components, the sampler converting each of the narrowband components from an analog component to a digital component; and
a processor, the processor reconstructing a plurality of filtered components, each of the digital components using a transform to reconstruct each of the filtered components, the processor combining the plurality of filtered components to generate a profile.

32. The module of claim 31 wherein the profile is an image.

33. The module of claim 31 wherein the profile comprises a signal profile.

34. A noise reduction module for use and improvement of MRI, MRS, MRSI, or NQR comprising:
more than one antenna, each antenna receiving a narrowband signal;
a sampler in communication with the each of the narrowband components, the sampler converting each of the narrowband components from an analog component to a digital component; and
a processor, the processor reconstructing a plurality of filtered components, each of the digital components using a transform to reconstruct each of the filtered components, the processor combining the plurality of filtered components to generate a profile.

35. The module of claim 34 wherein the profile is an image.

36. The module of claim 35 wherein the profile comprises a signal profile.

37. A method of reducing scan time of an analog signal analyzer comprising:
receiving the broadband signal at an antenna;
dividing the broadband signal into a plurality of data channels, each of the data channels spanning a frequency range;
individually sampling each of the data channels into a digital components;
reconstructing each of the digital components using a discrete transform to form a plurality of reconstructed data sets such that the noise of the data sets is reduced;
reducing the scan time of a sample using an effective noise reduction module, the effective noise reduction module adapted to exchange signal to noise quality levels for scan time; and
combining the reconstructed data sets to form a signal profile.

38. A multi-channel data processing system, the system comprising:
a plurality of receiver coils, the receiver coils receiving an input signal, each of the coils filtering the input signal into a plurality of data channels; each of the data channels having a unique center frequency and associated with one of the plurality of coils;
an A/D converter attached to each data channel, each data channel sampled at a sampling rate;
a processor performing a multi-spectral transform such as an Inverse Fourier Transform on each of the data channels, the processor outputting a set of reconstructed data; and
a summing module adapted to sum the reconstructed data into a signal profile.

39. A method of improving the effective magnetic strength of a magnetic resonance data acquisition system, the method comprising:
(a) obtaining a multi-frequency signal;
(b) separating the multi-frequency signal into a plurality of frequency bands, each band of the plurality of frequency bands having a respective bandwidth;
(c) removing a noise component from each of the plurality of frequency bands to generate a plurality of noise-reduced frequency bands; and
(d) regulating the combination of a predefined number of noise-reduced frequency bands to form a combined noise-reduced frequency signal and control the effective strength of the data acquisition system.

40. A method of reducing sample scan period during magnetic resonance data acquisition relative to a conventional MRI scan period $T_1$, the conventional MRI scan period having an associated data quality level, the method comprising the steps of:
(a) scanning a sample of interest for a scan period $T_2$ while obtaining a multi-frequency signal, the signal comprising MRI data for a sample of interest, wherein the scan period $T_2$ is substantially equal to $T_1/N$;
(b) separating the multi-frequency signal into a plurality of frequency bands, each band of the plurality of frequency bands having a respective bandwidth, wherein N is a function of a count of the plurality of frequency bands;
(c) removing a noise component from each of the plurality of frequency bands to generate a plurality of noise-reduced frequency bands; and
(d) combining a predefined number of noise-reduced frequency bands to form a combined noise-reduced frequency signal, the combined noise-reduced frequency having a substantially equivalent data quality level.

41. A method of reducing the number of data samples used to produce a profile, the method comprising the steps of:
generating a broadband signal;
dividing the broadband signal into narrowband components;
sampling the narrowband components at reduced sampling rates using a sampler configured based on reduced Nyquist-Shannon sampling rate limitations associated with sampling of the narrowband components rather than the broadband signal; and
transforming and recombining a sampled signal from each narrowband component into the profile.

42. The method of claim 41 wherein the profile is selected from the group consisting of an image, an image profile, a signal, and a signal profile.

43. A method of acquiring NQR data with respect to a target, the method comprising the steps of serially
applying electromagnetic radiation to the target to excite various frequency ranges associated with the nuclei of the target and thereby generate nuclear quadrupole resonance effects from the target;
detecting the nuclear quadrupole resonance effects from each frequency range in sequence; and
repeating this process of serial application and detection to each frequency range using a repetition interval.

44. The method of claim 43 wherein each step is performed using a coil in electrical communication with a CRISP NQR frequency filter-bank.

45. The method of claim 43 wherein at least one step of applying electromagnetic radiation to the target is performed simultaneously with at least one step of detecting one of the nuclear quadrupole resonance effects.

46. The method of claim 43 wherein one step of applying electromagnetic radiation to the target is performed simultaneously with all other steps of applying electromagnetic radiation to the target.

47. The method of claim 43 wherein one step of detecting one of the nuclear quadrupole resonance effects is performed simultaneously with other steps of detecting one of the nuclear quadrupole resonance effects.

48. The method of claim 43 wherein at least one of the steps of applying radiation and one of the steps of detecting one of the nuclear quadrupole resonance effects are performed in an interleaved manner as a function of a time period $T_1$.

49. The method of claim 43 wherein the time period $T_1$ is related to a relaxation period associated with a particular nuclear species.

50. The method of claim 43 wherein the repetition interval of excitation and detection for each frequency range may vary according to the relaxation properties of the main target substances such that not every frequency range may be excited during every repetition interval.

51. A method of processing data, the method comprising:
(a) obtaining a multi-frequency signal;
(b) separating the multi-frequency signal into a plurality of narrow frequency bands, each band of the plurality of narrow frequency bands having a respective bandwidth;
(c) removing a noise component from each of the plurality of narrow frequency bands to generate a plurality of noise-reduced narrow frequency bands; and
(d) transforming each respective noise-reduced narrow frequency band independently to generate a plurality of individual transform sets such that cross-frequency noise contributions are reduced; and
(e) combining a predefined number of the of individual transform sets to generate a combined noise-reduced frequency signal.

52. A method of detecting a material of interest, the method comprising the steps of
selecting a plurality of frequency ranges suitable for exciting nuclear quadrupole resonance effects in a material of interest;
obtaining a plurality of NQR data sets in response to excitation and detection of effects for a candidate object, the excitation generated in response to the plurality of frequency ranges;
correlating the plurality of NQR data sets relative to each other and known nuclear quadrupole resonance data associated with the material of interest; and
determining a probability that the material of interest is present in the candidate object.

53. A method of processing multi-frequency signals comprising:
(a) obtaining a multi-frequency signal using a signal receiving element;
(b) separating the multi-frequency signal into a plurality of frequency bands, each band of the plurality of frequency bands having a respective bandwidth;
(c) removing a noise component from each of the plurality of frequency bands to generate a plurality of noise-reduced frequency bands; and
(d) combining a predefined number of noise-reduced frequency bands to form a combined noise-reduced frequency signal.

54. The method of claim 53 wherein the signal receiving element is selected from the group consisting of a plurality of coils, a single coil, and an element for performing the step of separating the multi-frequency signal is selected from the group consisting of a plurality of coils, a filter-bank element, and a plurality of filter bank elements.

55. The method of claim 53 where in the noise removal in (c) is a reduction of noise performed as a function of a signal level associated with the multi-frequency signal.

56. The method of claim 53 where in the combination of data in (d) occurs by a step selected from the group of concatenating and mathematical combining which is performed using data associated with the noise-reduced frequency bands.

57. The method of claim 53 wherein the multi-frequency signal is a MRI generated signal and the receiving element comprises a plurality of RF coils, wherein the RF coils are parallel configured to reduce signal acquisition time or increase spatial resolution in a phase encoding direction.

58. The method of claim 53 wherein a processing step is selected from the group consisting of acquiring narrowband data, reconstructing intra-band data, and inter-band data recombination is performed with respect to the multi-frequency signal to reduce cross-frequency noise.

59. The method of claim 53 wherein the multi-frequency signal is generated by exciting a target portion of a target volume, the target volume comprising a plurality of target portions wherein the signal receiving element is a narrowband channel signal receiver.

60. The method of claim 59 wherein one narrowband multi-frequency signal is generated for each target portion of the target volume.

61. The method of claim 59 wherein a combination of a plurality of target portions is excited such that the multi-frequency signal is received by a plurality of narrowband channel signal receivers.

62. The method of claim 53 wherein the signal receiving element is a plurality of coils.

63. The method of claim 62 wherein at least one of the coils is oriented in a phase encoding direction or a frequency encoding direction.

64. The method of claim 53 wherein at least one of the coils is oriented in a direction other than a phase encoding direction or a frequency encoding direction.

65. The method of claim 53 further comprising the step of performing spectral division of the multi-frequency signal such that an increase in a signal-to-noise ratio occurs relative to not performing the spectral division.

66. The method of claim 53 wherein the step of removing the noise component from each of the plurality of frequency bands includes identifying a plurality of magnetic gradients that encode a known spatial displacement of noise in resulting images and reducing the noise in a final image by using this known spatial displacement.

* * * * *